(12) United States Patent
Yamazaki et al.

(10) Patent No.: US 8,389,989 B2
(45) Date of Patent: Mar. 5, 2013

(54) TRANSISTOR HAVING OXIDE SEMICONDUCTOR LAYER AND DISPLAY UTILIZING THE SAME

(75) Inventors: Shunpei Yamazaki, Setagaya (JP);
Toshinari Sasaki, Atsugi (JP);
Junichiro Sakata, Atsugi (JP); Masashi Tsubuku, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 22 days.

(21) Appl. No.: 12/869,278

(22) Filed: Aug. 26, 2010

(65) Prior Publication Data
US 2011/0057186 A1 Mar. 10, 2011

(30) Foreign Application Priority Data
Sep. 4, 2009 (JP) ................................. 2009-204801

(51) Int. Cl.
*H01L 29/12* (2006.01)
(52) U.S. Cl. .............. 257/43; 257/258; 257/83; 257/84; 257/88; 257/72; 257/E29.596; 438/149
(58) Field of Classification Search .................... 257/72, 257/43, 258, 83, 84, 88, E29.596
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,533,965 B1 * | 3/2003 | Sasaki et al. | ............... 252/519.5 |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |

(Continued)

FOREIGN PATENT DOCUMENTS

| | | |
|---|---|---|
| EP | 1737044 A | 12/2006 |
| EP | 1770788 A | 4/2007 |

(Continued)

OTHER PUBLICATIONS

Written Opinion (Application No. PCT/JP2010/063670) Dated Sep. 21, 2010.

(Continued)

*Primary Examiner* — Marcos D. Pizarro
*Assistant Examiner* — Eva Yan Montalvo
(74) *Attorney, Agent, or Firm* — Eric J. Robinson; Robinson Intellectual Property Law Office, P.C.

(57) ABSTRACT

It is an object to manufacture a highly reliable display device using a thin film transistor having favorable electric characteristics and high reliability as a switching element. In a bottom gate thin film transistor including an amorphous oxide semiconductor, an oxide conductive layer having a crystal region is formed between an oxide semiconductor layer which has been dehydrated or dehydrogenated by heat treatment and each of a source electrode layer and a drain electrode layer which are formed using a metal material. Accordingly, contact resistance between the oxide semiconductor layer and each of the source electrode layer and the drain electrode layer can be reduced; thus, a thin film transistor having favorable electric characteristics and a highly reliable display device using the thin film transistor can be provided.

12 Claims, 14 Drawing Sheets

U.S. PATENT DOCUMENTS

| | | |
|---|---|---|
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,394 B2 | 8/2009 | Furuta et al. |
| 7,674,650 B2 | 3/2010 | Akimoto et al. |
| 7,719,185 B2 | 5/2010 | Jin et al. |
| 7,732,819 B2 | 6/2010 | Akimoto et al. |
| 7,745,798 B2 | 6/2010 | Takahashi |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186437 A1 | 7/2009 | Akimoto |
| 2009/0186445 A1 | 7/2009 | Akimoto |
| 2009/0189155 A1 | 7/2009 | Akimoto |
| 2009/0189156 A1 | 7/2009 | Akimoto |
| 2009/0239335 A1 | 9/2009 | Akimoto et al. |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0305461 A1 | 12/2009 | Akimoto et al. |
| 2010/0003783 A1 | 1/2010 | Akimoto |
| 2010/0038639 A1 | 2/2010 | Akimoto |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0163876 A1 | 7/2010 | Inoue et al. |
| 2011/0003427 A1 | 1/2011 | Sasaki et al. |
| 2011/0003428 A1 | 1/2011 | Sasaki et al. |
| 2011/0006302 A1 | 1/2011 | Yamazaki et al. |
| 2011/0008930 A1 | 1/2011 | Sasaki et al. |
| 2011/0008931 A1 | 1/2011 | Yamazaki et al. |
| 2011/0031496 A1 | 2/2011 | Yamazaki et al. |
| 2011/0031497 A1 | 2/2011 | Yamazaki et al. |
| 2011/0053322 A1 | 3/2011 | Sasaki et al. |

FOREIGN PATENT DOCUMENTS

| | | |
|---|---|---|
| EP | 1983499 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 A | 3/2003 |
| JP | 2003-086808 | 3/2003 |
| JP | 2004-103957 | 4/2004 |
| JP | 2004-273614 A | 9/2004 |
| JP | 2004-273732 A | 9/2004 |
| JP | 2007-081362 | 3/2007 |
| JP | 2007-096055 A | 4/2007 |
| JP | 2007-123861 A | 5/2007 |
| JP | 2007-165861 A | 6/2007 |
| JP | 2007-171932 | 7/2007 |
| JP | 2007-212699 A | 8/2007 |
| JP | 2008-535205 | 8/2008 |
| JP | 2008-281988 A | 11/2008 |
| JP | 2009-265271 | 11/2009 |

| | | |
|---|---|---|
| JP | 2010-098280 | 4/2010 |
| WO | WO-2004/114391 | 12/2004 |
| WO | WO-2007/058329 | 5/2007 |
| WO | WO-2007/089048 | 8/2007 |
| WO | WO-2008/126879 | 10/2008 |

OTHER PUBLICATIONS

International Search Report (Application No. PCT/JP2010/063670) Dated Sep. 21, 2010.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In—Ga—Zn—O TFTS,", SID Digest '08: SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7,8,9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08: SID International Symposium Digest of Technical Papers, May 30, 2008, vol. 39, pp. 633-636.

Nowatari.H et al., "60.2: Intermediate Connector With Suppressed Voltage Loss for White Tandem OLEDS,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02: Proceedings of the 9th International Display Workshops, Dec. 4, 2002, pp. 295-298.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09: SID International Symposium Digest of Technical Papers, May 31, 2009, pp. 280-283.

Jin.D et al., "65.2:Distinguished Paper:World-Largest (6.5") Flexible Full Color Top Emission AMOLED Display on Plastic Film and Its Bending Properties,", SID Digest '09: SID International Symposium Digest of Technical Papers, May 31, 2009, pp. 983-985.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09: SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09: SID International Symposium Digest of Technical Papers, May 31, 2009, pp. 284-287.

Miyasaka.M, "SUFTLA Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09: SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09: SID International Symposium Digest of Technical Papers, May 31, 2009, pp. 395-398.

Lee.H et al., "Current Status of, Challenges to, and Perspective View of AM-OLED,", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 105, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; Fe, Ga, Or Al; B: Mg, Mn, Fe, Ni, Cu,or Zn] at Temperatures of 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AMOLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08: Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.

Nakamura et al., "The Phase Relations in the $In_2O_3$—$Ga_2ZnO_4$—Zno System at 1350° C," Journal of Solid State Chemistry, Aug. 1, 1991, vol. 93, No. 2, pp. 298-315.

Osada et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Ohara et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Sakata et al., "Development of 4.0-In. AMOLED Display with Driver Circuit Using Amorphous In—Ga—Zn-Oxide TFTS," IDW '09: Proceedings of the 16$^{th}$ International Display Workshops, 2009, pp. 689-692.

Park et al., "Amorphous Indium—Gallium—Zinc Oxide TFTs and their Application for Large Size AMOLED," AM-FPD '08 Digest of Technical Papers, Jul. 2, 2008, pp. 275-277.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

* cited by examiner

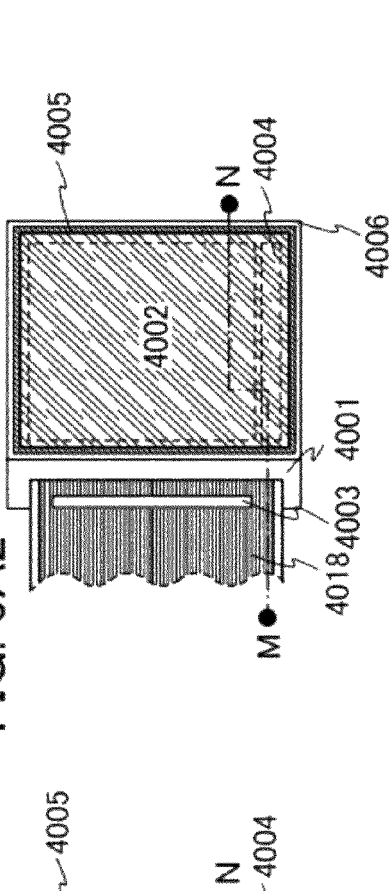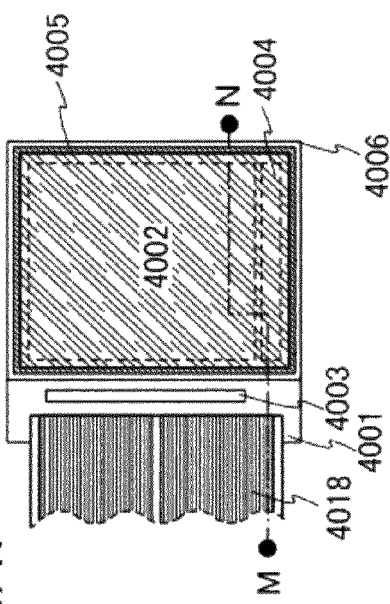

TRANSISTOR HAVING OXIDE SEMICONDUCTOR LAYER AND DISPLAY UTILIZING THE SAME

TECHNICAL FIELD

The present invention relates to a display device including an oxide semiconductor.

BACKGROUND ART

In recent years, a technique for forming a thin film transistor (TFT) by using a semiconductor thin film (having a thickness of approximately several nanometers to several hundred nanometers) formed over a substrate having an insulating surface has attracted attention. Thin film transistors are applied to a wide range of electronic devices such as ICs or electro-optical devices, and thin film transistors are rapidly developed particularly as switching elements in image display devices. Various metal oxides are used for a variety of applications. Indium oxide is a well-known material and is used as a light-transmitting electrode material which is necessary for liquid crystal displays and the like.

Some metal oxides have semiconductor characteristics. The examples of such metal oxides having semiconductor characteristics include tungsten oxide, tin oxide, indium oxide, zinc oxide, and the like. Thin film transistors in which a channel formation region is formed using such a metal oxide having semiconductor characteristics are already known (for example, see Patent Documents 1 and 2).

A thin film transistor including an amorphous oxide semiconductor has relatively high field-effect mobility among thin film transistors including other amorphous semiconductors. Therefore, a driver circuit of a display device or the like can also be formed using the thin film transistor including an amorphous oxide semiconductor.

Reference

[Patent Document]
[Patent Document 1] Japanese Published Patent Application No. 2007-23861
[Patent Document 2] Japanese Published Patent Application No. 2007-96055

DISCLOSURE OF INVENTION

When a pixel portion (also referred to as a pixel circuit) and a driver circuit portion are formed over one substrate in a display device or the like, a transistor used for the pixel portion needs to have excellent switching characteristics, for example, a high on/off ratio, and a thin film transistor used for the driver circuit portion needs to operate at high speed.

In particular, as a display device has higher pixel density, the transistor used for the driver circuit portion preferably operates at a higher speed in order that time to write a display image is shortened.

An embodiment of the present invention disclosed in this specification relates to a transistor which solves the above-described problems and a display device including the transistor.

An embodiment of the present invention disclosed in this specification is a transistor where an oxide conductive layer is included in a source region and a drain region and a semiconductor layer is formed using an oxide semiconductor. In addition, the above embodiment includes a display device where a driver circuit portion and a display portion (also referred to as a pixel portion) which each include the transistor are formed over one substrate.

According to one embodiment of the present invention disclosed in this specification, a transistor includes a gate electrode layer, a gate insulating layer over the gate electrode layer, an oxide semiconductor layer over the gate insulating layer, an oxide conductive layer partly overlapping with the oxide semiconductor layer over the gate insulating layer, a source electrode layer and a drain electrode layer over the oxide conductive layer, and an oxide insulating layer in contact with the oxide semiconductor layer. The oxide conductive layer includes a crystal region.

According to another embodiment of the present invention disclosed in this specification, a transistor includes a gate electrode layer, a gate insulating layer over the gate electrode layer, a source electrode layer and a drain electrode layer over the gate insulating layer, an oxide conductive layer over the source electrode layer and the drain electrode layer, an oxide semiconductor layer partly overlapping with the oxide conductive layer over the gate insulating layer, and an oxide insulating layer in contact with the oxide semiconductor layer. The oxide conductive layer includes a crystal region.

In the above respective structures, the source electrode layer and the drain electrode layer of the transistor can be formed using a film including a metal element selected from Al, Cr, Cu, Ta, Ti, Mo, and W as its main component or an alloy film thereof. The source electrode layer and the drain electrode layer are not limited to single layers containing the above-described element, and stacked layers of different films may also be used.

The oxide conductive layer is formed between the oxide semiconductor layer and each of the source electrode layer and the drain electrode layer of the transistor, whereby contact resistance can be reduced; therefore, a transistor capable of high-speed operation can be realized. The oxide conductive layer can be formed using a film of indium oxide, an indium oxide-tin oxide alloy, an indium oxide-zinc oxide alloy, zinc oxide, zinc aluminum oxide, zinc aluminum oxynitride, zinc gallium oxide, or the like, which includes a crystal region.

In addition, in the above respective structures, the oxide insulating layer functions as a channel protective layer of the transistor. The oxide insulating layer can be formed using silicon oxide, silicon nitride oxide, aluminum oxide, aluminum oxynitride, or the like, which is formed with a sputtering method.

Moreover, a display device can be manufactured using an EL element, a liquid crystal element, an electrophoretic element, or the like by forming a driver circuit portion and a display portion (also referred to as a pixel portion) over one substrate using the transistor which is an embodiment of the present invention.

According to another embodiment of the present invention disclosed in this specification, a display device includes a pixel portion and a driver circuit portion each including a transistor over one substrate, and the transistor includes a gate electrode layer over the substrate, a gate insulating layer over the gate electrode layer, an oxide semiconductor layer over the gate insulating layer, an oxide conductive layer partly overlapping with the oxide semiconductor layer over the gate insulating layer, a source electrode layer and a drain electrode layer over the oxide conductive layer, and an oxide insulating layer in contact with the oxide semiconductor layer. The oxide conductive layer includes a crystal region.

According to another embodiment of the present invention disclosed in this specification, a display device includes a pixel portion and a driver circuit portion each including a transistor over one substrate, and the transistor includes a gate electrode layer over the substrate, a gate insulating layer over the gate electrode layer, a source electrode layer and a drain electrode layer over the gate insulating layer, an oxide conductive layer over the source electrode layer and the drain electrode layer, an oxide semiconductor layer partly overlapping with the oxide conductive layer over the gate insulating layer, and an oxide insulating layer in contact with the oxide semiconductor layer. The oxide conductive layer includes a crystal region.

In a pixel portion including a plurality of transistors of the display device which is an embodiment of the present invention, there is also a region where a gate electrode of one transistor is connected to a source wiring or a drain wiring of another transistor. In addition, in a driver circuit portion of the display device which is an embodiment of the present invention, there is a region where a gate electrode of a transistor is connected to a source wiring or a drain wiring of the transistor.

Since a transistor is easily broken due to static electricity or the like, a protective circuit for protecting a transistor of a pixel portion is preferably provided over the same substrate as a gate line or a source line. The protective circuit is preferably formed using a non-linear element including an oxide semiconductor layer.

An oxide conductive layer including a crystal region is formed between an oxide semiconductor layer and each of a source electrode layer and a drain electrode layer, whereby a transistor having favorable electric characteristics and high reliability can be manufactured.

BRIEF DESCRIPTION OF DRAWINGS

FIGS. 6A1 and 6A2 are plan views and FIG. 6B is a cross-sectional view illustrating a display device.

BEST MODE FOR CARRYING OUT THE INVENTION

Figure 1A:
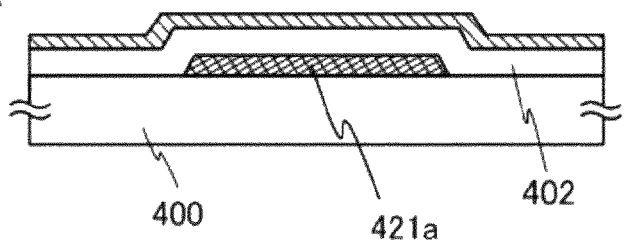
FIGS. 1A to 1E are cross-sectional process views of a transistor according to an embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments below. Note that in the drawings of this specification, the identical portions or portions having a similar function are denoted by the identical reference numerals, and description thereon may be omitted.

(Embodiment 1)

In this embodiment, an embodiment of a thin film transistor and a manufacturing method thereof will be described.

Figure 1B:
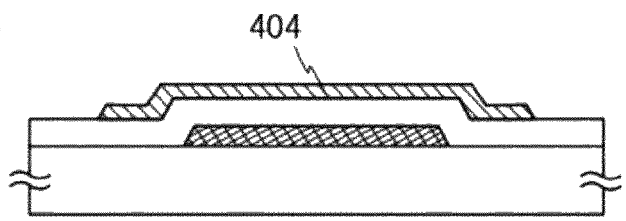
Figure 1C:
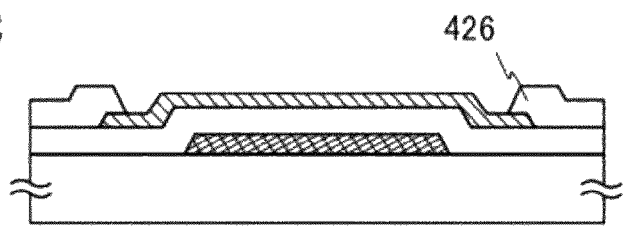
Figure 1D:
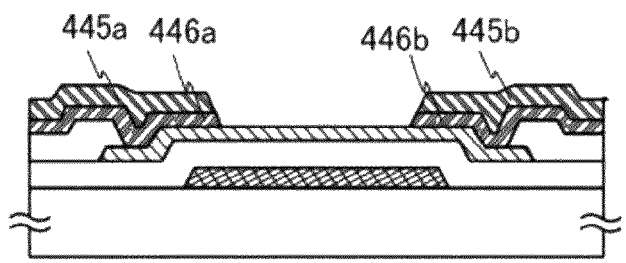
Figure 1E:
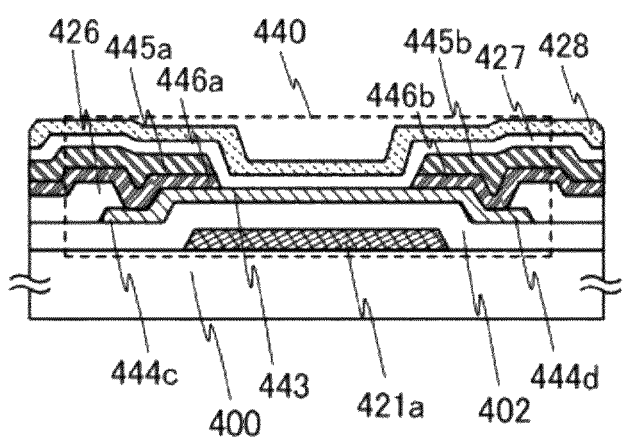

FIG. 1E illustrates a cross-sectional view of a thin film transistor 440 having a bottom gate structure which is referred to as a channel-etched type.

The thin film transistor 440 includes, over a substrate 400 having an insulating surface, a gate electrode layer 421a, a gate insulating layer 402, an oxide semiconductor layer including a channel formation region 443, a source electrode layer 445a, and a drain electrode layer 445b. In addition, an insulating layer 427 and a protective insulating layer 428 are provided over the channel formation region 443, an oxide conductive layer 446a, an oxide conductive layer 446b, the source electrode layer 445a, and the drain electrode layer 445b.

A first region 444c and a second region 444d of the oxide semiconductor layer, which each overlap with an oxide insulating layer 426, may be provided in an oxygen-excess state like the channel formation region 443 so as to have a function of reducing leak current and parasitic capacitance.

Note that the ordinal numbers such as "first" and "second" in this specification are used for convenience and do not denote the order of steps or the stacking order of layers. In addition, the ordinal numbers in this specification do not denote particular names which specify the present invention.

Here, the oxide conductive layers 446a and 446b are formed using a material with high conductivity, which includes a crystal region, and can reduce contact resistance between the oxide semiconductor layer and each of the source electrode layer 445a and the drain electrode layer 445b, so that a thin film transistor capable of high-speed operation can be realized.

A process of manufacturing the thin film transistor 440 is described below with reference to FIGS. 1A to 1E.

First, after a conductive film is formed over the substrate 400 having an insulating surface, the gate electrode layer 421a is formed in a first photolithography step.

Note that a resist mask used for the photolithography step may be formed with an ink-jet method. When the resist mask is formed with an ink-jet method, manufacturing costs can be reduced because a photomask is not used.

As a material of the conductive film of the gate electrode layer 421a, an element selected from Al, Cr, Ta, Ti, Mo, and W, an alloy including the above element, a stacked film in which any of the above-described elements are combined, and the like can be given. Alternatively, metal oxide or the like may be used.

As the substrate 400, a glass substrate of aluminosilicate glass, aluminoborosilicate glass, or barium borosilicate glass can be used, for example. In the case where the temperature at which heat treatment is performed later is high, it is preferable to use a glass substrate whose strain point is greater than or equal to 730° C.

Note that, instead of the glass substrate described above, a substrate formed using an insulator, such as a ceramic substrate, a quartz substrate, or a sapphire substrate, may be used as the substrate 400.

Although not illustrated, an insulating layer serving as a base film may be provided between the substrate 400 and the gate electrode layer 421a. The base film has a function of preventing diffusion of an impurity element from the substrate 400, and can be formed using a single-layer structure or a stacked structure of one or more of a silicon nitride film, a silicon oxide film, a silicon nitride oxide film, and a silicon oxynitride film.

Next, the gate insulating layer 402 is formed over the gate electrode layer 421a.

The gate insulating layer 402 can be formed using a light-transmitting insulating film such as a silicon oxide layer, a silicon nitride layer, a silicon oxynitride layer, or a silicon nitride oxide layer with a plasma CVD method, a sputtering method, or the like. The gate insulating layer 402 is not limited to the single layer of the insulating film described above, and a stacked layer of different films may also be used. For example, a silicon oxynitride film can be formed with a plasma CVD method using silane ($SiH_4$), oxygen, and nitrogen as a film formation gas. The thickness of the gate insulating layer 402 is 100 nm to 500 nm inclusive. In the case of a stacked structure, for example, a first gate insulating layer having a thickness of 50 nm to 200 nm inclusive and a second gate insulating layer having a thickness of 5 nm to 300 nm are stacked in this order.

In this embodiment, the gate insulating layer 402 is formed using a silicon oxynitride (SiON (composition ratio: N<O)) layer having a thickness of 100 nm formed with a plasma CVD method.

Next, over the gate insulating layer 402, an oxide semiconductor film is formed to a thickness of 5 nm to 200 nm inclusive, preferably, 10 nm to 20 nm inclusive (see FIG. 1A). The thickness is preferably as thin as 50 nm or less in order that the oxide semiconductor film keeps the amorphous state even when heat treatment for dehydration or dehydrogenation is performed after the formation of the oxide semiconductor film. Reduction in thickness can prevent the oxide semiconductor film from being crystallized when heat treatment is performed after the formation of the oxide semiconductor layer.

As the material of the oxide semiconductor film, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, and a Sn—Al—Zn—O-based metal oxide, or a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—O-based metal oxide, a Sn—O-based metal oxide, and a Zn—O-based metal oxide can be used. The above oxide semiconductor film may include $SiO_2$.

As the oxide semiconductor film, a thin film expressed by $InMO_3 (ZnO)_m$ (m>0) can be used. Here, M represents one or more metal elements selected from Ga, Al, Mn, and Co. For example, Ga, Ga and Al, Ga and Mn, or Ga and Co can be given as M. An oxide semiconductor film whose composition formula is represented as $InMO_3 (ZnO)_m$ (m>0) where at least Ga is included as M is referred to as the In—Ga—Zn—O-based oxide semiconductor described above, and a thin film thereof is also referred to as an In—Ga—Zn—O-based film.

In this embodiment, as the oxide semiconductor film, an In—Ga—Zn—O-based film having a thickness of 15 nm is formed with a sputtering method using a target for forming an In—Ga—Zn—O-based oxide semiconductor.

Formation of the In—Ga—Zn—O-based film can be performed using an In—Ga—Zn—O-based oxide semiconductor target ($In_2O_3$:$Ga_2O_3$:ZnO=1:1:1 [in a molar ratio] (that is, In:Ga:Zn=1:1:0.5 [in an atomic ratio])) under the following conditions: the distance between a substrate and a target is 100 mm; the pressure is 0.6 Pa; the direct-current (DC) power supply is 0.5 kW; and the atmosphere is oxygen (the flow rate of oxygen is 100%). Alternatively, a target having a composition ratio of In:Ga:Zn=1:1:1 [in an atomic ratio] or In:Ga:Zn:=1:1:2 [in an atomic ratio] may be used. In addition, the filling factors of these targets are 90% to 100% inclusive, preferably, 95% to 99.9% inclusive. An oxide semiconductor film which is formed becomes dense with the use of a metal oxide target having a high filling factor.

Examples of a sputtering method include an RF sputtering method in which a high-frequency power source is used for a sputtering power source, a DC sputtering method in which a DC power source is used, and a pulsed DC sputtering method in which a bias is applied in a pulsed manner. An RF sputtering method is mainly used in the case where an insulating layer is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Furthermore, there are also a reactive sputtering method in which a target substance and a sputtering gas component are chemically reacted with each other during film formation to form a thin compound film thereof, a bias sputtering method in which voltage is also applied to a substrate during film formation, and the like.

Note that before the oxide semiconductor film is formed with a sputtering method, dust on a surface of the gate insulating layer 402 is preferably removed by reverse sputtering in which an argon gas is introduced and plasma is generated. The reverse sputtering refers to a method in which, without application of voltage to a target side, a surface of a substrate is modified in such a manner that an RF power source for voltage application is used to a substrate side under an argon atmosphere and ionized argon is collided with the substrate. Note that nitrogen, helium, oxygen, or the like may be used instead of argon.

Before the oxide semiconductor film is formed, heat treatment (at higher than or equal to 400° C. and lower than the strain point of the substrate) may be performed under an atmosphere of an inert gas (e.g., nitrogen, helium, neon, or argon) so that impurities such as hydrogen and water, which are included in the gate insulating layer 402, are removed.

Then, the oxide semiconductor film is processed into an island-shaped oxide semiconductor layer in a second photolithography step (see FIG. 1B). Further, a resist mask for forming the island-shaped oxide semiconductor layer 404 may be formed with an ink-jet method. When the resist mask is formed with an ink-jet method, manufacturing costs can be reduced.

Next, the oxide semiconductor layer 404 is dehydrated or dehydrogenated. First heat treatment for dehydration or dehydrogenation is performed at a temperature which is higher than or equal to 400° C., preferably, higher than 425° C., and lower than the strain point of a substrate under an atmosphere of an inert gas such as nitrogen or a rare gas (e.g., helium, neon, or argon), using an electric furnace or the like. Note that in the case of the temperature which is higher than 425° C., the heat treatment time may be 1 hour or shorter, whereas in the case of the temperature which is lower than 425° C., the heat treatment time is longer than 1 hour. As another heating method, rapid thermal anneal (RTA) treatment which is performed at 650° C. for approximately 3 minutes using a high-temperature inert gas or light may be performed. Since dehydration or dehydrogenation can be performed in a short time with the RTA method, the first heat treatment can be performed even at a temperature over the strain point of a glass substrate.

Note that in this specification, heat treatment under an atmosphere of an inert gas such as nitrogen, a rare gas, or the like is referred to as heat treatment for dehydration or dehydrogenation. In this specification, "dehydrogenation" does not indicate only elimination of $H_2$. For convenience, elimination of H, OH, and the like is referred to as "dehydration or dehydrogenation".

In addition, it is important not to remix water or hydrogen into the oxide semiconductor layer which is dehydrated or dehydrogenated without exposure to the air. In a transistor using an oxide semiconductor layer which is obtained in such a manner that an i-type oxide semiconductor layer is changed into an n-type (e.g., $n^-$-type or $n^+$-type) oxide semiconductor layer, i.e. a low-resistant oxide semiconductor layer, by dehydration or dehydrogenation and then the n-type oxide semiconductor layer is changed into an i-type oxide semiconductor layer again so as to have high resistance, the threshold voltage of the transistor can be positive voltage, so that the transistor shows so-called normally-off characteristics. It is preferable that a transistor used for a display device be formed with a positive threshold voltage which is as close to 0 V as possible. In an active matrix display device, the electric characteristics of a transistor included in a circuit are important and influence the performance of the display device. The threshold voltage of the transistor is particularly important. Note that if the threshold voltage of the transistor is negative, the transistor shows so-called normally-on characteristics; in other words, current flows between a source electrode and a drain electrode even when the gate voltage is 0 V. Accordingly, it is difficult to control the circuit including the transistor. Even when the transistor has positive threshold voltage, the transistor cannot perform a switching operation itself because the driving voltage is insufficient in the case where the absolute value of the threshold voltage is large. In the case of an n-channel transistor, it is preferable that a channel be formed and drain current begins to flow after the positive voltage is applied as a gate voltage. A transistor in which a channel is not formed unless the driving voltage is high and a transistor in which a channel is formed and then a drain current flows even when a negative voltage is applied are not suitable as the transistor used for a circuit.

An atmosphere under which the temperature at which dehydration or dehydrogenation is performed is decreased may be switched to an atmosphere different from that under which the temperature is increased or heat treatment is performed. For example, cooling is performed by using the same furnace in which dehydration or dehydrogenation is performed and by filling the furnace with a high-purity oxygen gas, a high-purity $N_2O$ gas, or ultra-dry air (having a dew point of lower than −40° C., preferably, lower than −60° C.) without exposure to the air.

Note that in the first heat treatment, it is preferable that water, hydrogen, and the like be not contained in nitrogen or a rare gas such as helium, neon, or argon. Alternatively, it is preferable that nitrogen or a rare gas such as helium, neon, or argon introduced into a heat treatment apparatus have purity of 6N (99.9999%) or more, preferably, 7N (99.99999%) or more.

In the case where heat treatment is performed under an atmosphere of an inert gas, an initially i-type oxide semiconductor layer is changed into an oxygen-deficient oxide semiconductor layer by the heat treatment to be an n-type (e.g., $n^-$-type) oxide semiconductor layer, i.e. a low-resistant oxide semiconductor layer. Then, the oxide semiconductor layer is placed in an oxygen-excess state by formation of an oxide insulating layer which is in contact with the oxide semiconductor layer so as to be a high-resistance oxide semiconductor layer, i.e. an i-type oxide semiconductor layer. Accordingly, it is possible to manufacture a thin film transistor having favorable electric characteristics and high reliability.

In the oxide semiconductor layer which is sufficiently dehydrated or dehydrogenated under the above conditions, at least a peak at around 250° C. to 300° C. of two peaks in spectra which show discharge of moisture is not detected with thermal desorption spectroscopy (TDS) even when the temperature of the dehydrated or dehydrogenated oxide semiconductor layer is increased to 450° C.

Figure 11:
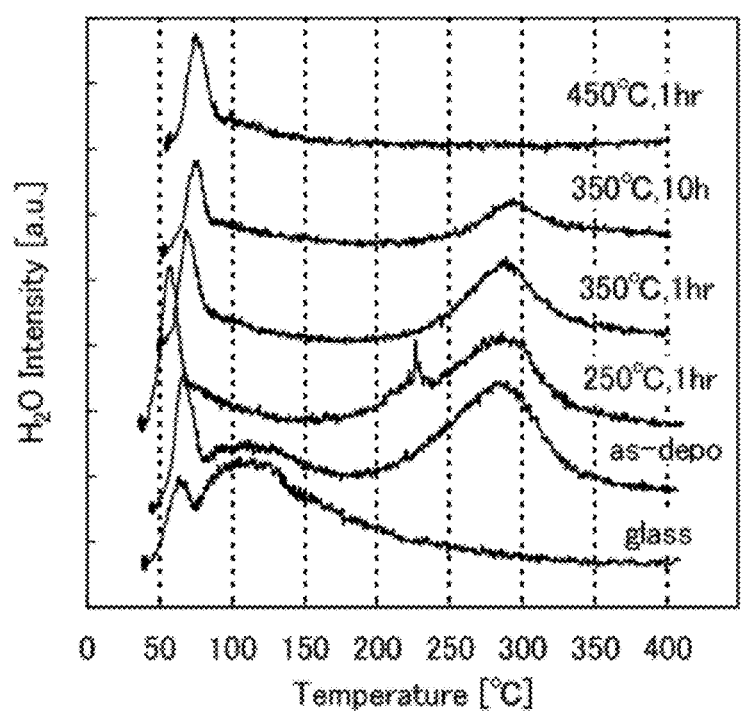
FIG. 11 shows TDS spectra of moisture.

FIG. 11 shows results of analyzing discharge of moisture with thermal desorption spectroscopy (TDS) in a plurality of samples each of which is subjected to heat treatment under a nitrogen atmosphere at a certain temperature.

The thermal desorption spectroscopy is a method for detecting and identifying, using a quadrupole mass spectrometer, a gas component which is discharged or generated from a sample when the sample is heated and the temperature thereof is increased in high vacuum; thus, a gas and a molecule discharged from surfaces and insides of the samples can be observed. With the use of a thermal desorption spectroscopy apparatus manufactured by ESCO Ltd. (product name: 1024amu QMS), measurement was performed under the following conditions: the rising temperature was at approximately 10° C./min; the pressure was $1 \times 10^{-8}$ (Pa) at the beginning of the measurement; and the pressure was at a degree of vacuum of approximately $1 \times 10^{-7}$ (Pa) during the measurement.

FIG. 11 shows a graph that compares TDS measurement results in terms of moisture by manufacturing the following samples in each of which an In—Ga—Zn—O-based film having a film thickness of 50 nm is formed over the glass substrate: a sample which is not heated (as-deposited) and a sample processed at 250° C. for 1 hour, a sample processed at 350° C. for 1 hour, a sample processed at 350° C. for 10 hours, and a sample processed at 450° C. for 1 hour; and a sample of the glass substrate alone (not heated). The results in FIG. 11 indicate that the higher the heating temperature under a nitrogen atmosphere is, the more moisture which is discharged from the In—Ga—Zn—O-based film is reduced, and that, in the sample heated at 450° C., no peak at 200° C. to 350° C. is observed in a spectrum which shows discharge of moisture.

Observed are two peaks of spectra which show discharge of moisture at a high temperature of 200° C. or more from the In—Ga—Zn—O-based film: a first peak which appears at a temperature between 200° C. and 250° C.; and a second peak which appears at a temperature between 250° C. and 350° C. The first peak which appears at a temperature between 200° C. and 250° C. is not clear in the samples other than the sample heated at 250° C. In the as-deposited sample, this is because two peaks overlap with each other and thus there is apparently a spectrum having one peak. Further, in the samples which are subjected to heat treatment at 350° C., this is because moisture is somewhat discharged and thus the first peak is substantially disappeared. These can also be confirmed from a symmetric property of a peak position of each spectrum and the fact that the peak position of each spectrum is shifted to a higher temperature side.

In addition, the vertical axis of the graph of FIG. 11 represents an arbitrary unit, where existence of discharged gas is relatively seen. These shapes of the spectra each show similar change with respect to heat treatment regardless of the area or volume of an object to be measured. Accordingly, the spectra can be effectively used as observation of a process monitor or a means for failure analysis. In other words, existence of a peak in a temperature range of 200° C. to 350° C. is examined, whereby it is possible to confirm a record that indicates whether an appropriate process has been conducted or not.

Note that even in the case where the sample which is subjected to heat treatment at 450° C. under a nitrogen atmosphere is left at room temperature under an air atmosphere approximately for one week, discharge of moisture at 200° C. or more was not observed. Thus, it is found that by performing the heat treatment, the In—Ga—Zn—O-based film becomes stable.

Figure 12:
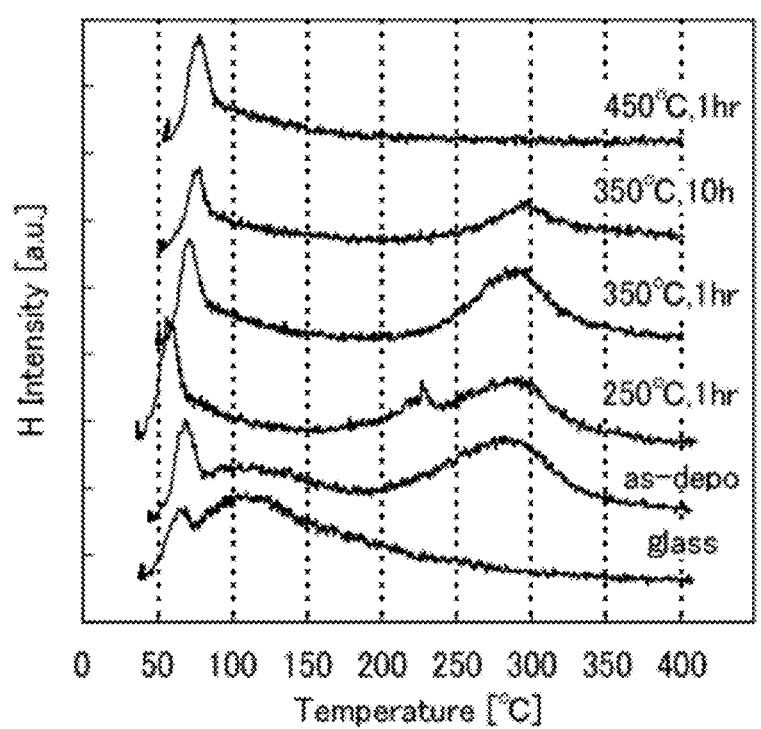
FIG. 12 shows TDS spectra of H.
Figure 13:
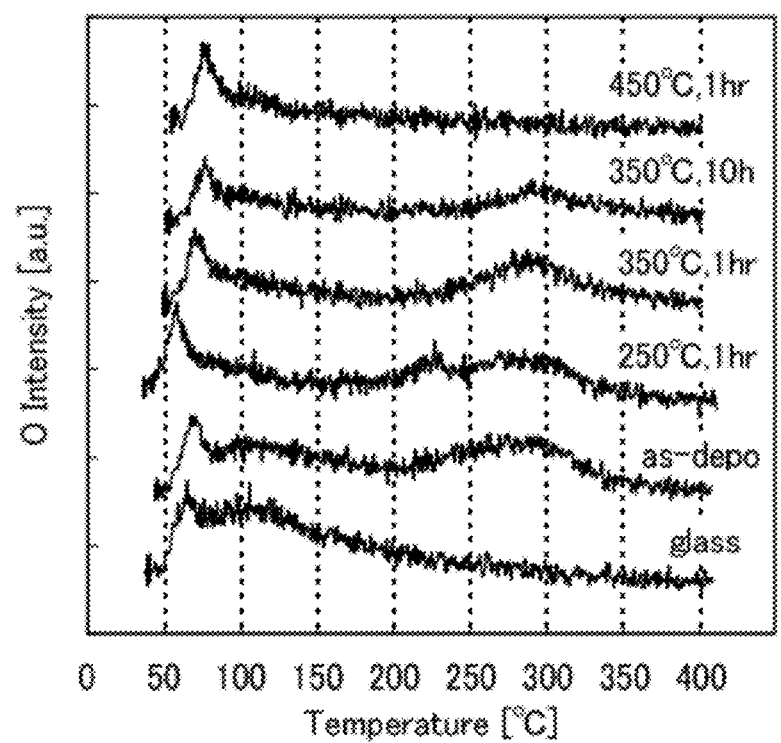
FIG. 13 shows TDS spectra of O.
Figure 14:
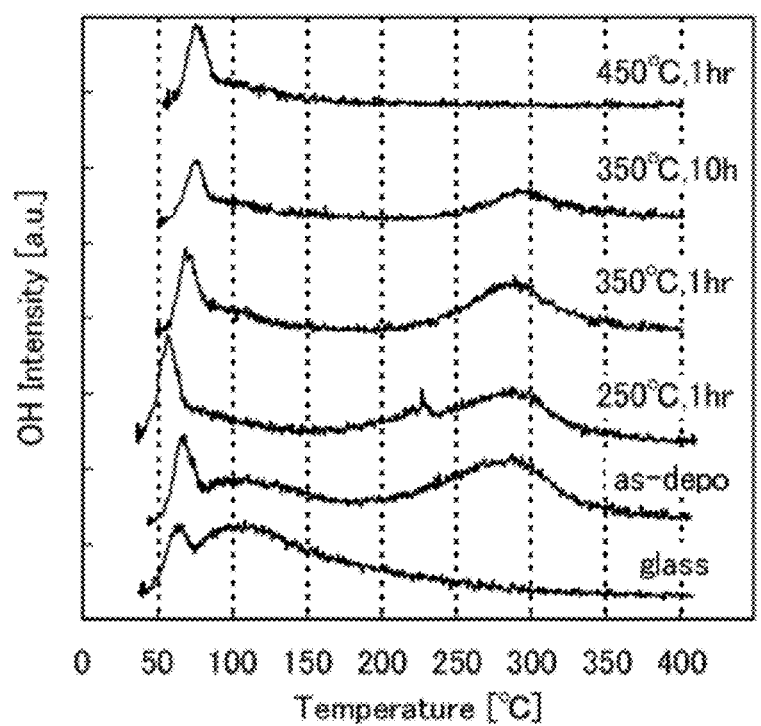
FIG. 14 shows TDS spectra of OH.

Further, TDS measurement was performed using samples which have been subjected to a heating step under the same conditions as those of the samples in each of which discharge of moisture has been measured in order to measure H, O, OH, $H_2$, $O_2$, N, $N_2$, and Ar in addition to $H_2O$. It was possible that spectra which show discharge of H, O, and OH from some of the samples be clearly observed. FIG. 12 shows TDS spectra of H. FIG. 13 shows TDS spectra of O. FIG. 14 shows TDS spectra of OH. The measurement result of a glass substrate alone (not heated) is added to TDS spectra of moisture, H, O, and OH for comparison. Note that the oxygen concentration under a nitrogen atmosphere in the above heat conditions is 20 ppm or less.

The spectra which show discharge of H, O, and OH tend to be similar to the spectra which show discharge of moisture and indicate that, in the sample heated at 450° C., no peak is observed which shows each discharge component that appears around 250° C. to 300° C.

The above results indicate that, by performance of the heat treatment of the In—Ga—Zn—O-based film, moisture, H, O, and OH are discharged. Since discharge of H, O, and OH tends to be performed in a state similar to that of moisture, it can be said that most of the discharge of H, O, and OH is derived from a water molecule.

Here, in this embodiment, the substrate is introduced into an electric furnace, which is one of heat treatment apparatuses, and the heat treatment of the oxide semiconductor layer is performed under a nitrogen atmosphere. Then, the oxide semiconductor layer is not exposed to air, which prevents the oxide semiconductor layer from remixing water or hydrogen, so that an oxide semiconductor layer is obtained. In addition, slow cooling is performed in a nitrogen atmosphere in one furnace from the heating temperature T at which the oxide semiconductor layers are dehydrated or dehydrogenated to a temperature low enough to prevent water from coming in, specifically to a temperature more than 100° C. lower than the heating temperature T. Without limitation to a nitrogen atmosphere, dehydration or dehydrogenation is performed in a rare gas atmosphere such as helium, neon, or argon.

The oxide semiconductor layer is partly crystallized in some cases, depending on a condition of the first heat treatment or a material of the oxide semiconductor layer. After the first heat treatment, the oxide semiconductor layer 404 which is changed into an oxygen-deficient oxide semiconductor layer to be a low-resistant oxide semiconductor layer is obtained (see FIG. 1B). The carrier concentration of the oxide semiconductor layer is higher after the first heat treatment than that of the oxide semiconductor film just after the film formation, accordingly; it is preferable that the oxide semiconductor layer 404 have a carrier concentration of $1 \times 10^{18}$ /cm$^3$ or more. Note that the oxide semiconductor layer is preferably amorphous but may be partly crystallized. Note that in this specification, even in the state where the oxide semiconductor layer is partly crystallized, it is referred to as an "amorphous" state.

Further, the gate electrode layer 421a is crystallized to be a microcrystalline film or a polycrystalline film in some cases, depending on a condition of the first heat treatment or a material of the gate electrode layer 421a. For example, in the case where a film of an indium oxide-tin oxide alloy is used as the gate electrode layer 421a, the film is crystallized by the first heat treatment at 450° C. for 1 hour.

Alternatively, the first heat treatment may be performed on the oxide semiconductor film before it is processed into the island-shaped oxide semiconductor layer. In that case, after the first heat treatment, the substrate is taken out from the heat treatment apparatus, and then the second photolithography step is performed.

Next, an oxide insulating film is formed over the gate insulating layer 402 and the oxide semiconductor layer 404 with a sputtering method. Then, a resist mask is formed in a third photolithography step, and the oxide insulating layers 426 are formed by selective etching. After that, a step of removing the resist mask may be performed. At this phase, the regions are formed that overlap with the oxide insulating layers 426 which cover the peripheral portion and side surface of the oxide semiconductor layer (the first region 444c and the second region 444d of the oxide semiconductor layer), whereby leakage current and parasitic capacitance can be reduced (see FIG. 1E).

The oxide insulating layer 426 can be formed with a thickness of at least 1 nm with a method with which impurities such as water or hydrogen are not mixed into the above oxide insulating layer, as appropriate. In this embodiment, the oxide insulating layer 426 is formed using a silicon oxide film which is formed with a sputtering method.

The substrate temperature at the time of film formation may be from room temperature to 300° C. inclusive and, in this embodiment, is 100° C. The silicon oxide film can be formed with a sputtering method under an atmosphere of a rare gas (typically, argon), an oxygen atmosphere, or a mixed atmosphere containing a rare gas (typically, argon) and oxygen.

Moreover, a silicon oxide target or a silicon target can be used as a target. For example, with the use of a silicon target, a silicon oxide film can be formed with a sputtering method under an atmosphere of oxygen and a rare gas. The oxide insulating layer which is formed in contact with the oxide semiconductor layer whose resistance is reduced is formed using an inorganic insulating film that does not contain impurities such as moisture, a hydrogen ion, OH— and blocks entry of such impurities from the outside. Typically, a silicon oxide film, a silicon nitride oxide film, an aluminum oxide film, an aluminum oxynitride film, or the like can be used.

In this embodiment, the film formation is performed with a pulsed DC sputtering method using a columnar polycrystalline silicon target to which boron is added (the resistivity is 0.01 Ωcm and the purity is 6N), in which the distance between substrate and target (T-S distance) is 89 mm, the pressure is 0.4 Pa, the direct-current (DC) power is 6 kW, and the atmosphere is oxygen (the oxygen flow rate is 100%). The film thickness thereof is 300 nm Next, an oxide conductive film and a metal film are stacked over the gate insulating layer 402, the oxide insulating layers 426, and the oxide semiconductor layer 404. With a sputtering method, film formation of the stacked layer of the oxide conductive film and the metal film can be performed continuously without exposure to air.

As the material of the oxide conductive film, for example, any of the following conductive metal oxide materials can be employed: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; or a Zn—O-based metal oxide. The thickness of the oxide conductive film is selected as appropriate in the range of 50 nm to 300 nm inclusive. In this embodiment, a zinc oxide film is used.

As a material of the metal film, an element selected from Ti, Mo, W, Al, Cr, Cu, and Ta, an alloy containing any of these elements as a component, or the like is used. The above metal film is not limited to a single layer and a stacked layer of different films can be used. In this embodiment, a three-layer-stacked film in which a molybdenum film, an aluminum film, and a molybdenum film are stacked is used.

Next, a resist mask is formed in a fourth photolithography step, and the metal film is selectively etched to form the source electrode layer 445a and the drain electrode layer 445b. After that, the resist mask is removed. Note that an alkaline solution is used as a resist stripper to remove the resist mask. In the case where the resist stripper is used, the zinc oxide film is also selectively etched using the source electrode layer 445a and the drain electrode layer 445b as masks.

In this manner, the oxide conductive layer 446a is formed under and in contact with the source electrode layer 445a, and the oxide conductive layer 446b is formed under and in contact with the drain electrode layer 445b (see FIG. 1D).

By providing the oxide conductive layer 446a between the source electrode layer 445a and the oxide semiconductor layer, contact resistance can be reduced, which leads to resistance reduction, so that a thin film transistor capable of high-speed operation can be realized. The oxide conductive layer 446a provided between the source electrode layer 445a and the oxide semiconductor layer functions as a source region, and the oxide conductive layer 446b provided between the drain electrode layer 445b and the oxide semiconductor layer functions as a drain region, which are effective in improvement the frequency characteristics in the case where, for example, a peripheral circuit (driver circuit) is formed over one substrate.

In the case where a molybdenum film and the oxide semiconductor layer are directly in contact with each other, the contact resistance is increased. This is because molybdenum is less likely to be oxidized as compared to titanium and thus extracts a small amount of oxygen from the oxide semiconductor layer, which does not allow the interface between the molybdenum and the oxide semiconductor layer to be n-type oxide semiconductor. However, even in that case, by providing the oxide conductive layer between the oxide semiconductor layer and each of the source electrode layer and the drain electrode layer, the contact resistance can be reduced.

The etching rate is different between the oxide semiconductor layer and the oxide conductive layer, and therefore, the oxide conductive layer which is on and in contact with the oxide semiconductor layer can be removed by controlling the time of period.

After the metal film is selectively etched, the resist masks may be removed by an oxygen ashing treatment to leave the zinc oxide film, and then, the zinc oxide film may be selectively etched with the source electrode layer 445a and the drain electrode layer 445b as masks.

The resist mask for forming the source electrode layer 425a and the drain electrode layer 425b may be formed with an ink-jet method.

Next, the insulating layer 427 is formed over the oxide insulating layers 426, the source electrode layer 445a, the drain electrode layer 445b and oxide semiconductor layer 404. As the insulating layer 427, a silicon oxide film, a silicon nitride oxide film, an aluminum oxide film, an aluminum oxynitride film, or the like is used. In this embodiment, a silicon oxide film is formed as the insulating layer 427 with an RF sputtering method.

At this phase, second heat treatment is performed under an atmosphere of an inert gas such as nitrogen at a temperature of greater than or equal to 200° C. and less than or equal to 400° C., preferably, greater than or equal to 250° C. and less than or equal to 350° C. For example, heat treatment is performed under a nitrogen atmosphere at 250° C. for 1 hour.

In the second heat treatment, part of the insulating layer 427 which is an oxide and the oxide semiconductor layer 404 are heated while being in contact with each other. Therefore, in the oxide semiconductor layer 404 the resistance of which has been reduced through the first heat treatment, oxygen is supplied from the insulating layer 427 to make the oxide semiconductor layer 404 into an oxygen-excess state, whereby the oxide semiconductor layer 404 has high resistance (i-type conductivity).

Although the second heat treatment is performed after the formation of the silicon oxide film in this embodiment, the second heat treatment can be performed anytime after the formation of the silicon oxide film and the timing of the second heat treatment is not limited to just after the formation of the silicon oxide film.

In addition, in the case where the source electrode layer 445a and the drain electrode layer 445b are formed using a heat-resistant material, a step in which the conditions of the first heat treatment are used can be performed at the timing of the second heat treatment. In this case, the heat treatment can be performed only once after the formation of the silicon oxide film.

In the second heat treatment, the oxide conductive layers 446a and 446b are crystallized to each have a crystal region as long as a crystallization inhibitor such as silicon oxide is not contained in the oxide conductive layers 446a and 446b. For example, the oxide conductive layers tend to be crystallized into columnar-like crystals when zinc oxide or the like is used, and tend to be crystallized in a microcrystalline state when an indium oxide-tin oxide alloy is used. Consequently, realized is reduction of contact resistance between the oxide semiconductor layer and each of the source electrode layer 445a and the drain electrode layer 445b as well as improvement in conductivity. On the other hand, the In—Ga—Zn—O-based oxide semiconductor layer which is used in this embodiment is not crystallized even through the second heat treatment and thus an amorphous state thereof is maintained.

Next, the protective insulating layer 428 is formed over the insulating layer 427 (see FIG. 1E). As the protective insulating layer 428, a silicon nitride film, a silicon nitride oxide film, an aluminum nitride film, or the like can be used. In this embodiment, a silicon nitride film is formed as the protective insulating layer 428 with an RF sputtering method.

Through the steps described above, the thin film transistor 440 can be manufactured in which the oxide conductive layer having a crystal region is formed between the oxide semiconductor layer and each of the source electrode layer and the drain electrode layer.

Note that this embodiment can be freely combined with any of the other embodiments.

(Embodiment 2)

In this embodiment will be described an example of a bottom contact thin film transistor and a manufacturing process thereof, which is different from that of Embodiment 1, with reference to FIGS. 2A to 2E. FIGS. 2A to 2E are the same as FIGS. 1A to 1E except that there is a difference in part of the process. Therefore, the same portions are denoted by the same reference numerals, and detailed description of the same portions is omitted.

Figure 2A:
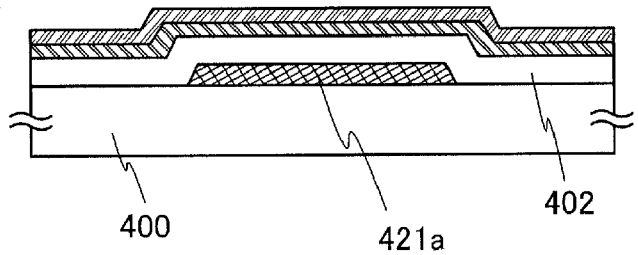
FIGS. 2A to 2E are cross-sectional process views of a transistor according to an embodiment of the present invention.
Figure 2B:
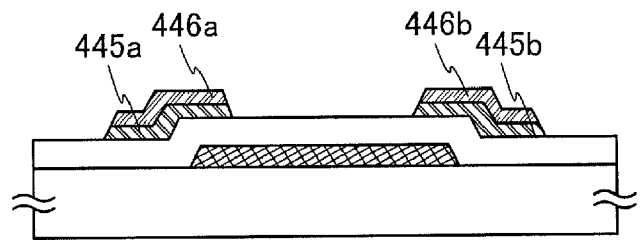
Figure 2C:
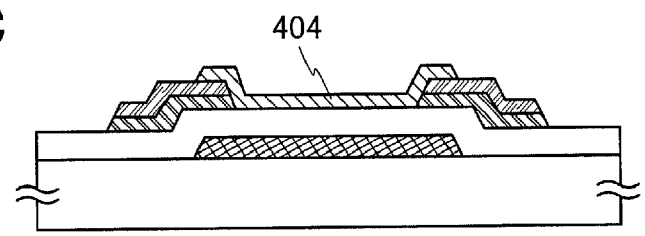
Figure 2D:
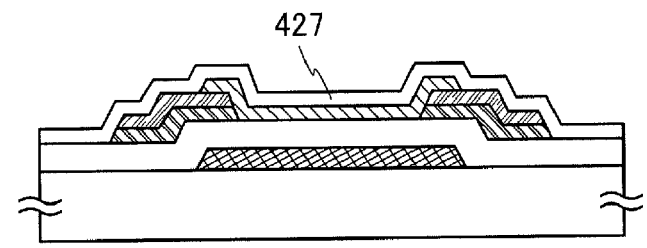
Figure 2E:
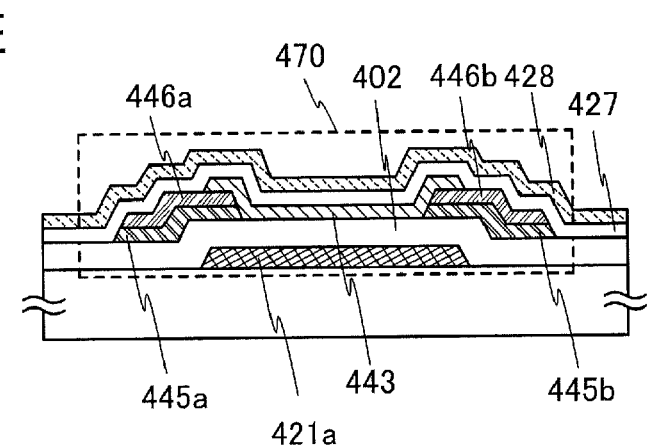

A thin film transistor 470 illustrated in FIG. 2E is a bottom gate structure which is referred to as a bottom contact type.

The thin film transistor 470 includes, over the substrate 400 having an insulating surface, the gate electrode layer 421a, the gate insulating layer 402, the source electrode layer 445a, the drain electrode layer 445b, the oxide conductive layer 446a, the oxide conductive layer 446b, and the oxide semiconductor layer including the channel formation region 443. In addition, the insulating layer 427 and the protective insulating layer 428 are provided over the channel formation region 443, the source electrode layer 445a, and the drain electrode layer 445b.

Here, the oxide conductive layers 446a and 446b are formed using a material with high conductivity, which includes a crystal region, and can reduce contact resistance between the oxide semiconductor layer and each of the source electrode layer 445a and the drain electrode layer 445b, so that a thin film transistor capable of high-speed operation can be realized.

A process of manufacturing the thin film transistor 470 is described below with reference to FIGS. 2A to 2E.

The gate electrode layer 421a and the gate insulating layer 402 are formed in accordance with Embodiment 1.

Next, a metal film and an oxide conductive film are stacked over the gate insulating layer 402 (see FIG. 2A). At this time, with a sputtering method, film formation of the stacked layer of the metal film and the oxide conductive film can be performed continuously without exposure to air. In this embodiment, a three-layer-stacked film in which a molybdenum film, an aluminum film, and a molybdenum film are stacked is used for the metal film, and a zinc oxide film is used for the oxide conductive film.

Next, a resist mask is formed in a photolithography step, and the metal film and the zinc oxide film are selectively etched to form the source electrode layer 445a, the drain electrode layer 445b, the oxide conductive layer 446a, and the oxide conductive layer 446b (see FIG. 2B). Here, an alkaline solution is used as a resist stripper to remove the resist mask. Since the zinc oxide film is also etched in some cases, it is preferable to remove the resist mask by oxygen ashing in order to prevent the zinc oxide film from being reduced in thickness.

Next, an oxide semiconductor film is formed in a manner similar to that of Embodiment 1, and the oxide semiconductor layer 404 is formed through a photolithography step and an etching step (see FIG. 2C).

Here, the oxide semiconductor layer is dehydrated or dehydrogenated in accordance with the method of the first heat treatment described in Embodiment 1.

Note that before the oxide semiconductor film is formed, heat treatment (at higher than or equal to 400° C. and lower than the strain point of the substrate) may be performed under an atmosphere of an inert gas (e.g., nitrogen, helium, neon, or argon) so that impurities such as hydrogen and water, which are included in the gate insulating layer 402, are removed.

Next, the insulating layer 427 is formed over the source electrode layer 445a, the drain electrode layer 445b, and the oxide semiconductor layer 404. As the insulating layer 427, a silicon oxide film, a silicon nitride oxide film, an aluminum oxide film, an aluminum oxynitride film, or the like is used. In this embodiment, a silicon oxide film is formed as the insulating layer 427 with an RF sputtering method.

Here, heat treatment is performed in accordance with the method of the second heat treatment described in Embodiment 1.

Although the second heat treatment is performed after the formation of the silicon oxide film in this embodiment, the second heat treatment can be performed anytime after the formation of the silicon oxide film and the timing of the second heat treatment is not limited to just after the formation of the silicon oxide film.

In addition, in the case where the source electrode layer 445a and the drain electrode layer 445b are formed using a heat-resistant material, a step in which the conditions of the first heat treatment are used can be performed at the timing of the second heat treatment.

Through any one of the heat treatment processes up to here, the oxide conductive layers 446a and 446b are crystallized to each have a crystal region as long as a crystallization inhibitor such as silicon oxide is not contained in the oxide conductive layers 446a and 446b. Needless to say, the heat treatment process may be performed plural times. On the other hand, the oxide semiconductor layer is not crystallized even through the heat treatment which is performed plural times and thus an amorphous state thereof is maintained.

Next, the protective insulating layer 428 is formed over the insulating layer 427 (see FIG. 2E).

Through the steps described above, the thin film transistor 470 can be manufactured in which the oxide conductive layer having a crystal region is formed between the oxide semiconductor layer and each of the source electrode layer and the drain electrode layer.

Note that this embodiment can be freely combined with any of the other embodiments.

(Embodiment 3)

In this embodiment will be described an example of a bottom contact thin film transistor and a manufacturing process thereof, which is different from those of Embodiments 1 and 2, with reference to FIGS. 3A to 3E. FIGS. 3A to 3E are the same as FIGS. 1A to 2E except that there is a difference in part of the process. Therefore, the same portions are denoted by the same reference numerals, and detailed description of the same portions is omitted.

Figure 3A:
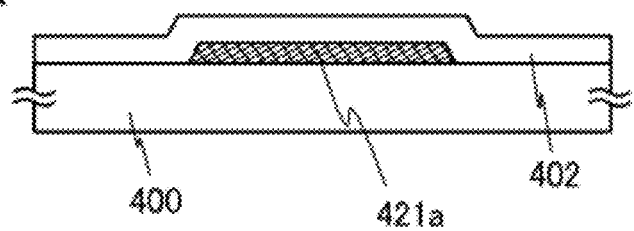
FIGS. 3A to 3E are cross-sectional process views of a transistor according to an embodiment of the present invention.
Figure 3B:
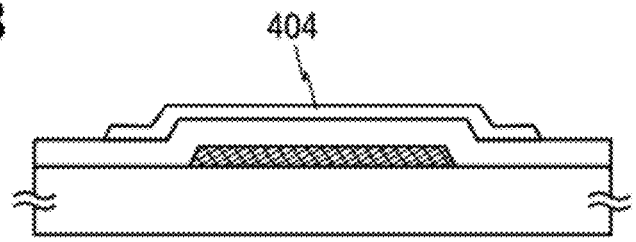
Figure 3C:
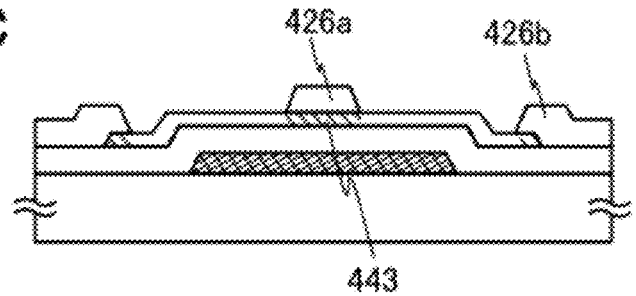
Figure 3D:
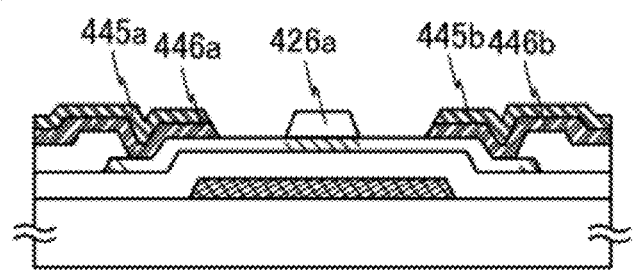
Figure 3E:
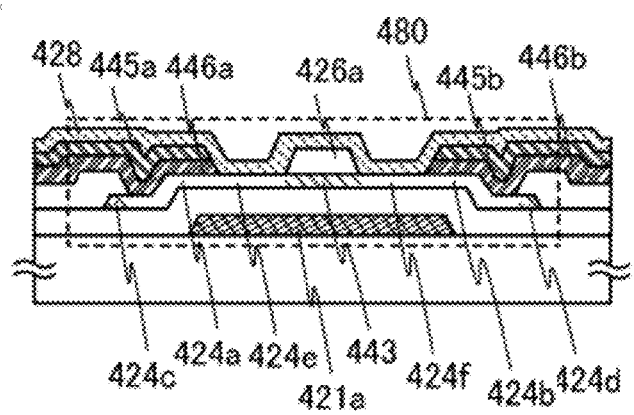

FIG. 3E illustrates a cross-sectional view of a thin film transistor 480 having a bottom gate structure which is referred to as a channel-protected type.

The thin film transistor 480 includes, over the substrate 400 having an insulating surface, the gate electrode layer 421a, the gate insulating layer 402, an oxide semiconductor layer, the oxide conductive layer 446a, the source electrode layer 445a, and the drain electrode layer 445b. Here, the oxide semiconductor layer includes the channel formation region 443, a high-resistance source region 424a, and a high-resistance drain region 424b. In addition, an oxide insulating layer 426a which functions as a channel protective layer is provided in contact with channel formation region 443. Further, the protective insulating layer 428 is provided over the source electrode layer 445a, the drain electrode layer 445b, the channel protective layer 426a, and the oxide semiconductor layer 404.

A first region 424c and a second region 424d of the oxide semiconductor layer, which each overlap with an oxide insulating layer 426b, are provided in an oxygen-excess state like the channel formation region 443, and may have a function of reducing leak current and parasitic capacitance.

A third region 424e of the oxide semiconductor layer, which is in contact with the protective insulating layer 428, is provided between the channel formation region 443 and the high-resistance source region 424a. A fourth region 424f of the oxide semiconductor layer, which is in contact with the protective insulating layer 428, is provided between the channel formation region 443 and the high-resistance drain region 424b.

The oxide conductive layers 446a and 446b are formed using a material with high conductivity, which includes a crystal region, and can reduce contact resistance between the oxide semiconductor layer and each of the source electrode layer 445a and the drain electrode layer 445b, so that a thin film transistor capable of high-speed operation can be realized.

The third region 424e and the fourth region 424f of the oxide semiconductor layer are a high-resistance source region (also referred to as an HRS region) which is an oxygen-deficient region and a high-resistance drain region (also referred to as an HRD region) which is an oxygen-deficient region, respectively. Specifically, the carrier concentration of the high-resistance drain region is greater than or equal to $1 \times 10^{18}/cm^3$ and is at least higher than the carrier concentration of the channel formation region (less than $1 \times 10^{18}/cm^3$).

Note that the carrier concentration in this embodiment is obtained by Hall effect measurement at room temperature. When the widths of the third region and fourth region in the channel length direction are large, an off-current of the thin film transistor can be reduced. In contrast, when the widths of the third region and fourth region in the channel length direction are small, the operation speed of the thin film transistor can be increased.

In a channel-protected thin film transistor, although the width of an oxide insulating layer which functions as a channel protective layer is reduced so that a substantial channel length L is easily shortened, a short circuit might be caused when a source electrode layer and a drain electrode layer are provided over the oxide insulating layer. Therefore, the source electrode layer 445a and the drain electrode layer 445b are provided so that end portions thereof are apart from the oxide insulating layer.

In FIG. 3E, a region of the oxide semiconductor layer under the oxide insulating layer 426a which functions as a channel protective layer is referred to as a channel formation region. Therefore, the channel length L of the thin film transistor 480 is equal to the width of the oxide insulating layer 426a in the channel length direction, and, in the cross-sectional view of FIG. 3E, corresponds to a length of the base of the trapezoidal oxide insulating layer 426a.

A process of manufacturing the thin film transistor 480 is described below with reference to FIGS. 3A to 3E.

The gate electrode layer 421a and the gate insulating layer 402 are formed in accordance with Embodiment 1 (see FIG. 3A).

Next, an oxide semiconductor film is formed in a manner similar to that of Embodiment 1, and the island-shaped oxide semiconductor layer 404 is formed through a photolithography step and an etching step (see FIG. 3B).

Note that before the oxide semiconductor film is formed, heat treatment (at higher than or equal to 400° C. and lower than the strain point of the substrate) may be performed under an atmosphere of an inert gas (e.g., nitrogen, helium, neon, or argon) so that impurities such as hydrogen and water, which are included in the gate insulating layer 402, are removed.

Here, the oxide semiconductor layer is dehydrated or dehydrogenated in accordance with the method of the first heat treatment described in Embodiment 1.

Alternatively, the first heat treatment may be performed on the oxide semiconductor film before it is processed into the island-shaped oxide semiconductor layer.

Next, an oxide insulating film is formed over the gate insulating layer 402 and the oxide semiconductor layer 404 with a sputtering method in a manner similar to that of Embodiment 1. Then, resist mask is formed in a photolithography step, and the oxide insulating layers 426a and 426b are formed by selective etching. After that, the resist mask may be removed. Here, a region of the oxide semiconductor layer under the oxide insulating layer 426a serves as a channel formation region (see FIG. 3C).

Next, an oxide conductive film and a metal film are stacked over the oxide insulating layer 426a, the oxide insulating layers 426b, and the oxide semiconductor layer and are partly etched to form the source electrode layer 445a, the drain electrode layer 445b, the oxide conductive layer 446a, and the oxide conductive layer 446b. With a sputtering method, film formation of the stacked layer of the oxide conductive film and the metal film can be performed continuously without exposure to air. In this embodiment, a three-layer-stacked film in which a molybdenum film, an aluminum film, and a molybdenum film are stacked is used for the metal film, and a zinc oxide film is used for the oxide conductive film (see FIG. 3D).

Next, second heat treatment is performed under an atmosphere of an inert gas such as nitrogen at a temperature of greater than or equal to 200° C. and less than or equal to 400° C., preferably, greater than or equal to 250° C. and less than or equal to 350° C. For example, heat treatment is performed under a nitrogen atmosphere at 250° C. for 1 hour.

In the second heat treatment, part of the oxide semiconductor layer 404 is heated while being in contact with the oxide insulating layers 426a and 426b. Therefore, in the oxide semiconductor layer 404 the resistance of which has been reduced through the first heat treatment, oxygen is supplied from the oxide insulating layers 426a and 426b to make the oxide semiconductor layer 404 into an oxygen-excess state, whereby the oxide semiconductor layer 404 has high resistance (i-type conductivity).

On the other hand, since part of the oxide semiconductor layer 404, which does not overlap with the oxide insulating layers 426a and 426b, is heated while being exposed, the third region 424e and fourth region 424f the resistance of which is maintained or further reduced can be formed.

Note that although the second heat treatment is performed after the formation of the oxide insulating layers 426a and 426b in this embodiment, the second heat treatment can be performed anytime after the formation of the oxide insulating layers 426a and 426b and the timing of the second heat treatment is not limited to just after the formation of the oxide insulating layers 426a and 426b.

Through the second heat treatment, the oxide conductive layers 446a and 446b are crystallized to each have a crystal region as long as a crystallization inhibitor such as silicon oxide is not contained in the oxide conductive layers 446a and 446b. On the other hand, the oxide semiconductor layer is not crystallized even through the second heat treatment and thus an amorphous state thereof is maintained.

Next, the protective insulating layer 428 is formed over the oxide semiconductor layer 404, the oxide insulating layer 426a, the oxide insulating layers 426b, the source electrode layer 445a, and the drain electrode layer 445b (see FIG. 3E). As the insulating layer 428, a silicon nitride film, a silicon nitride oxide film, an aluminum nitride film, or the like is used. In this embodiment, a silicon nitride film is formed as the protective insulating layer 428 with an RF sputtering method.

Through the steps described above, the thin film transistor 480 can be manufactured in which the oxide conductive layer having a crystal region is formed between the oxide semiconductor layer and each of the source electrode layer and the drain electrode layer.

Note that this embodiment can be freely combined with any of the other embodiments.

(Embodiment 4)

In this embodiment will be described an example in which an active matrix liquid crystal display device or light-emitting device is manufactured over one substrate using the thin film transistor described in any of Embodiments 1, 2, and 3.

Figure 4:
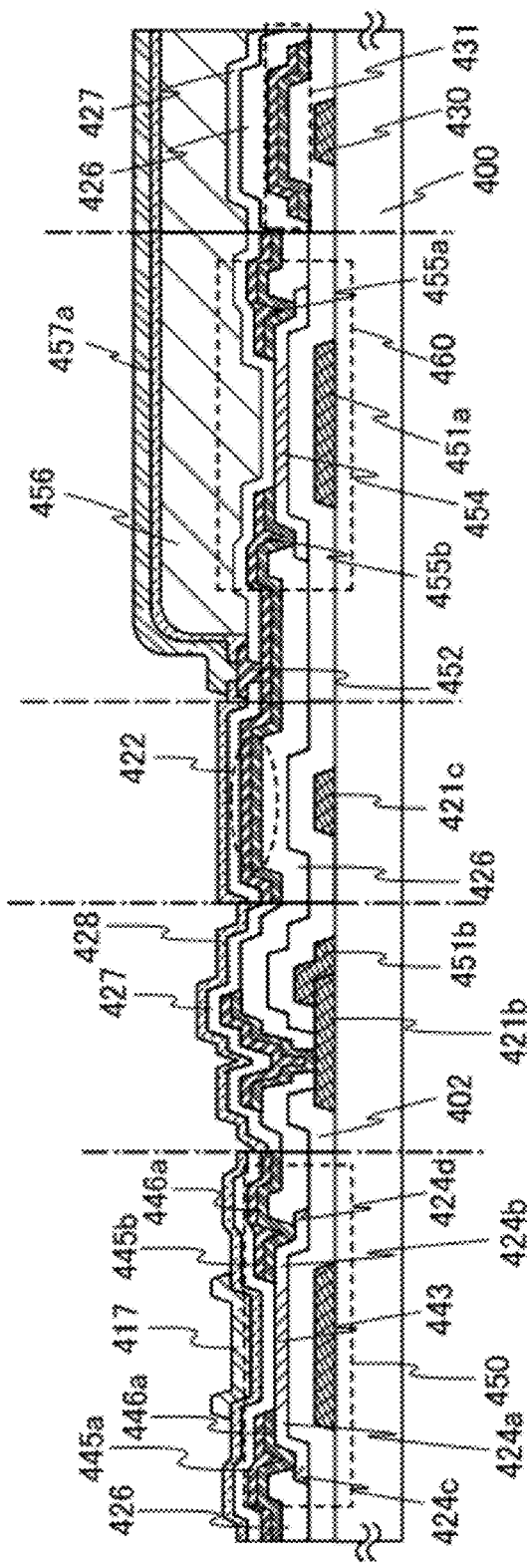
FIG. 4 is a cross-sectional view of a display device according to an embodiment of the present invention.

FIG. 4 illustrates an example of a cross-sectional structure of a liquid crystal display device using an active matrix substrate.

While in Embodiments 1, 2, and 3, modes of a thin film transistor are illustrated in the cross-sectional views, in this embodiment, a structure in which a driver circuit portion and a pixel portion are included over one substrate is described with a view illustrating the following: a thin film transistor 450 for the driver circuit portion; a thin film transistor 460 for the pixel portion; a gate wiring contact portion; a storage capacitor; a gate wiring, a source wiring, and an intersection thereof; a pixel electrode; and the like. The storage capacitor, the gate wiring, and the source wiring can be formed in the same manufacturing steps as the thin film transistors shown in Embodiments 1 and 2 and can be manufactured without an increase in the number of photomasks and an increase in the number of steps.

In FIG. 4, the thin film transistor 450 is a thin film transistor provided in the driver circuit portion and the thin film transistor 460 electrically connected to a pixel electrode layer 457a is a thin film transistor provided in the pixel portion.

In this embodiment, the thin film transistor 460 formed over the substrate 400 has the same structure as the thin film transistors in Embodiments 1, 2, and 3. Here, a channel-etched thin film transistor is shown as an example.

A capacitor wiring layer 430 which is formed using the same material in the same step as a gate electrode layer of the thin film transistor 460 overlaps with a capacitor electrode layer 431, with a gate insulating layer 402 serving as a dielectric interposed therebetween; thus, a storage capacitor is formed. Note that the capacitor electrode layer 431 is formed using the same material in the same step as an electrode layer and an oxide conductive layer which are provided in a source region or a drain region of the thin film transistor 460.

Note that the storage capacitor is provided below the pixel electrode layer 457a. Although not illustrated, the capacitor electrode layer 431 is electrically connected to the pixel electrode layer 457a.

This embodiment shows the example in which the storage capacitor is formed using the capacitor electrode layer 431 and the capacitor wiring layer 430; however, there is no particular limitation on the structure of the storage capacitor. For example, the storage capacitor may be formed in such a manner that, without provision of a capacitor wiring layer, a pixel electrode layer overlaps with a gate wiring in an adjacent pixel with a planarization insulating layer, a protective insulating layer, and a gate insulating layer interposed therebetween.

A plurality of gate wirings, source wirings, and capacitor wiring layers are provided in accordance with the pixel density. In a terminal portion, a plurality of first terminal electrodes at the same potential as the gate wiring, a plurality of second terminal electrodes at the same potential as the source wiring, a plurality of third terminal electrodes at the same potential as the capacitor wiring layer, and the like are arranged. The number of each of the terminals to be provided may be any number, and the number of each terminal may be determined as appropriate.

In the gate wiring contact portion, a gate electrode layer 421b can be formed using a low resistance metal material. The gate electrode layer 421b is electrically connected to the gate wiring through a contact hole that reaches the gate wiring.

The heat treatment for dehydration or dehydrogenation of the oxide semiconductor layer may be performed: after the oxide semiconductor layer is formed; after an oxide conductive layer is stacked over the oxide semiconductor layer; or after a passivation film is formed over a source electrode and a drain electrode.

A gate electrode layer of the thin film transistor 450 in the driver circuit portion may be electrically connected to a conductive layer 417 provided above the oxide semiconductor layer.

Further, in the wiring intersection, in order to reduce the parasitic capacitance as illustrated in FIG. 4, the gate insulating layer 402 and the oxide insulating layer 426 are sacked between a gate wiring layer 421c and a source wiring layer 422.

When an active matrix liquid crystal display device is manufactured, an active matrix substrate and a counter substrate provided with a counter electrode are fixed with a liquid crystal layer interposed therebetween. Similarly, with a plurality of microcapsules each including first particles having a positive charge and second particles having a negative charge disposed between two electrodes, an active matrix electrophoretic display device can be manufactured. A common electrode electrically connected to the counter electrode on the counter substrate is provided over the active matrix substrate, and a fourth terminal electrode electrically connected to the common electrode is provided in the terminal portion. The fourth terminal electrode is used for setting the common electrode to a fixed potential such as GND or 0 V. The fourth terminal electrode can be formed using the same material as the pixel electrode layer 457a.

When the same material is used for the gate electrode, the source electrode, the drain electrode, the pixel electrode, another electrode layer, and another wiring layer, a common sputtering target and a common manufacturing apparatus can be used, and thus the material costs and costs of an etchant (or an etching gas) used for etching can be reduced. As a result, manufacturing costs can be reduced.

When a photosensitive resin material is used for a planarization insulating layer 456 in the structure of FIG. 4, the step for forming a resist mask can be omitted.

Figure 5:
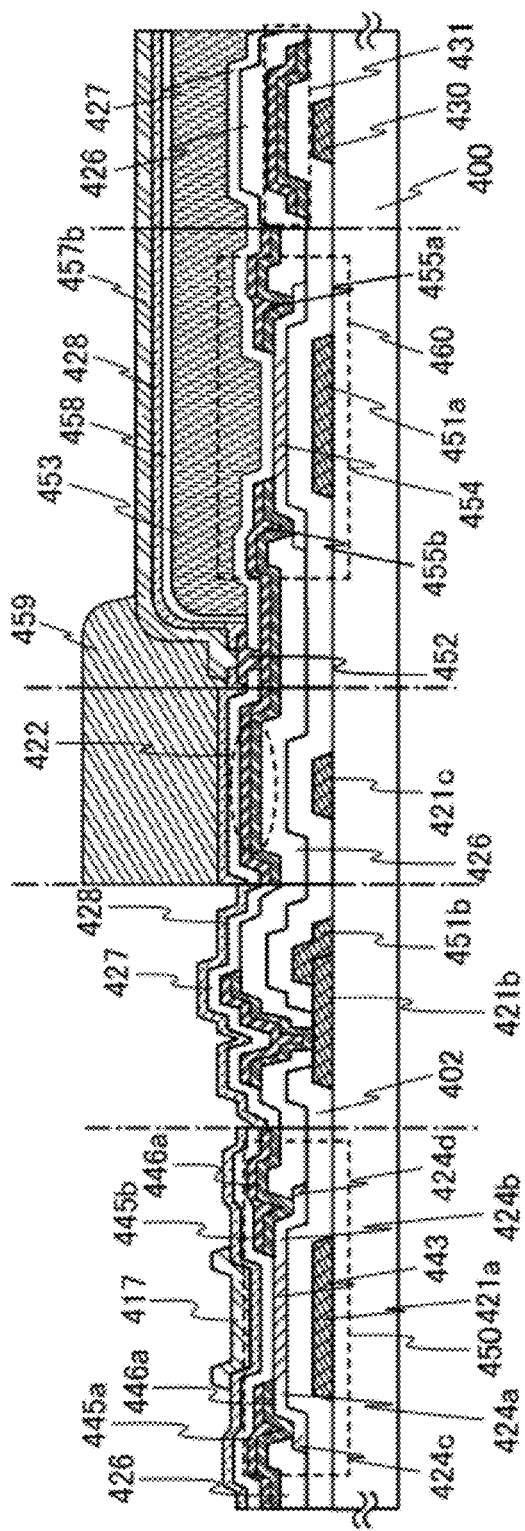
FIG. 5 is a cross-sectional view of a display device according to an embodiment of the present invention.

In addition, FIG. 5 illustrates a cross-sectional view in a state of a substrate of an active matrix light-emitting device before an EL layer is formed over a first electrode (a pixel electrode).

In FIG. 5, a channel-etched thin film transistor is illustrated; however, the thin film transistor having a structure similar to those described in Embodiments 2 and 3 can also be used. Moreover, the active matrix light-emitting device illustrated in FIG. 5 can have a structure similar to that of the above liquid crystal display device except for the structure of a pixel portion which will be shown below.

After an insulating layer 427 is formed, a color filter layer 453 is formed. The colors of the color filter layer are red, green, and blue. The color filter layers are sequentially formed in the specific positions with a printing method, an ink-jet method, a photolithography technique, an etching method, or the like. By providing the color filter layer 453 on the substrate 400 side, alignment of the color filter layer 453 and a light-emitting region of a light-emitting element can be performed without depending on the alignment accuracy of the sealing substrate.

Next, an overcoat layer 458 which covers the color filter layer 453 is formed. The overcoat layer 458 is formed using a light-transmitting resin.

Here, an example in which full-color display is performed using color filter layers of three colors of red, green, and blue; however, the color display is not particularly limited thereto. A color of cyan, magenta, yellow, or white may be used.

Next, a protective insulating layer 428 which covers the overcoat layer 458 and the insulating layer 427 is formed. For the protective insulating layer 428, an inorganic insulating film such as a silicon nitride film, an aluminum nitride film, a silicon nitride oxide film, or an aluminum oxynitride film is used.

Next, in a photolithography step and an etching step, a contact hole that reaches the connection electrode layer 452 is formed in the protective insulating layer 428 and the insulating layer 427. In addition, in this photolithography step and etching step, the protective insulating layer 428 and the insulating layer 427 in a terminal portion are selectively etched to expose part of a terminal electrode. Further, in order to connect a second electrode of a light-emitting element formed later to a common potential line, a contact hole that reaches the common potential line is also formed.

Next, a transparent conductive film is formed, and a photolithography step and an etching step are performed thereon, so that a first electrode 457b which is electrically connected to the connection electrode layer 452 is formed.

Next, a partition wall 459 is formed to cover the periphery of the first electrode 457b. The partition wall 459 is formed using an organic resin film of polyimide, acrylic, polyamide, epoxy, or the like, an inorganic insulating film, or organic polysiloxane. The partition wall 459 can be formed using an organic insulating material or an inorganic insulating material. It is preferable that the partition wall 459 be formed to have an opening over the first electrode 457b so that a sidewall is formed as an inclined surface with curvature. Such an opening can be easily formed using a photosensitive resin material.

Through the steps described above, the state of the substrate illustrated in FIG. 5 can be obtained. Further, an EL layer is formed over the first electrode 457b and the second electrode is formed over the EL layer, whereby a light-emitting element is formed. The second electrode is electrically connected to the common potential line.

The conductive layer 417 may be provided over the oxide semiconductor layer of the thin film transistor 450 of the driver circuit portion in each of FIG. 4 and FIG. 5. The conductive layer 417 can be formed using the same material in the same step as the pixel electrode layer 457a or the first electrode 457b.

The conductive layer 417 is provided so as to overlap with the channel formation region 443 of the oxide semiconductor layer, whereby the amount of change over time in threshold voltage of the thin film transistor 450 can be reduced. The conductive layer 417 has a potential which is the same as that of the gate electrode layer 421a, and can function as a second gate electrode layer. In addition, the conductive layer 417 may have a potential which is different from that of the gate electrode layer 421a. Alternatively, the potential of the conductive layer 417 may be GND or 0 V, or the conductive layer 417 may be in a floating state.

Since the thin film transistor is easily broken due to static electricity or the like, a protective circuit is preferably provided over the same substrate as the pixel portion or the driver circuit portion. The protective circuit is preferably formed with a non-linear element including an oxide semiconductor layer. For example, protective circuits are provided between the pixel portion and each of a scan-line input terminal and a signal-line input terminal In this embodiment, a plurality of protective circuits are provided so as to prevent breakage of a pixel transistor and the like which can be caused when a surge voltage due to static electricity or the like is applied to a scan line, a signal line, and a capacitor bus line. Therefore, the protective circuit is formed so as to release charge to a common wiring when a surge voltage is applied to the protective circuit. Further, the protective circuit includes non-linear elements arranged in parallel to each other with the scan line therebetween. The non-linear element includes a two-terminal element such as a diode or a three-terminal element such as a transistor. For example, the non-linear element can be formed through the same step as the thin film transistor 460 in the pixel portion, and can be made to have the same characteristics as a diode by connecting a gate terminal to a drain terminal of the non-linear element, for example.

Note that this embodiment can be freely combined with any of the other embodiments.

(Embodiment 5)

A semiconductor device having a display function (also referred to as a display device) can be manufactured using the thin film transistor described in any of Embodiments 1, 2, and 3. Moreover, a driver circuit portion and a pixel portion, which each include the thin film transistor, can be formed over one substrate, whereby a system-on-panel can be obtained.

A display device includes a display element. Further, a display medium whose contrast is changed by an electric effect, such as a liquid crystal element (also referred to as a liquid crystal display element) or an electronic ink, can be used.

Note that a display device in this specification means an image display device, a display device, or a light source (including a lighting device). Further, the "display device" includes the following modules in its category: a module including a flexible printed circuit (FPC) or a tape automated bonding (TAB) tape; a module having a TAB tape which is provided with a printed wiring board at the end thereof; and a module having an integrated circuit (IC) which is directly mounted on a display element with a chip on glass (COG) method.

The appearance and a cross section of a liquid crystal display panel, which is an embodiment of a display device, will be described with reference to FIGS. 6A1, 6A2, and 6B. FIGS. 6A1 and 6A2 are each a plan view of a panel in which thin film transistors 4010 and 4011 and a liquid crystal element 4013 are sealed between a first substrate 4001 and a second substrate 4006 with a sealant 4005 interposed therebetween. FIG. 6B is a cross-sectional view taken along line M-N in FIGS. 6A1 and 6A2.

The sealant 4005 is provided so as to surround a pixel portion 4002 and a scan-line driver circuit 4004 which are provided over the first substrate 4001. The second substrate 4006 is provided over the pixel portion 4002 and the scan-line driver circuit 4004. Therefore, the pixel portion 4002 and the scan-line driver circuit 4004 are sealed together with a liquid crystal layer 4008, by the first substrate 4001, the sealant 4005, and the second substrate 4006. Further, a signal-line driver circuit 4003 which is formed using a single crystal semiconductor or a polycrystalline semiconductor is mounted in a region different from the region surrounded by the sealant 4005 over the first substrate 4001.

Note that there is no particular limitation on the connection method of the signal-line driver circuit 4003, and a COG method, a wire bonding method, a TAB method, or the like can be used. FIG. 6A1 illustrates an example in which the signal-line driver circuit 4003 is mounted with a COG method, and FIG. 6A2 illustrates an example in which the signal-line driver circuit 4003 is mounted with a TAB method.

Each of the pixel portion 4002 and the scan-line driver circuit 4004 which are provided over the first substrate 4001 includes a plurality of thin film transistors. In FIG. 6B, the thin film transistor 4010 included in the pixel portion 4002 and the thin film transistor 4011 included in the scan-line driver circuit 4004 are illustrated as an example. Insulating layers 4041, 4020, and 4021 are provided over the thin film transistors 4010 and 4011.

Any of the highly reliable thin film transistors each including an oxide semiconductor layer, which are described in any of Embodiments 1, 2, and 3, can be used as the thin film transistors 4010 and 4011. In this embodiment, the thin film transistors 4010 and 4011 are n-channel thin film transistors.

A conductive layer 4040 is provided over the insulating layer 4021 so as to overlap with a channel formation region of an oxide semiconductor layer in the thin film transistor 4011 for the driver circuit. The conductive layer 4040 is provided so as to overlap with the channel formation region of the oxide semiconductor layer, whereby the amount of change over time in threshold voltage of the thin film transistor 4011 can be reduced. The conductive layer 4040 has a potential which is the same as that of the gate electrode of the thin film transistor 4011, and can function as a second gate electrode layer. In addition, the conductive layer 4040 may have a potential which is different from that of the gate electrode of the thin film transistor 4011. Alternatively, the potential of the conductive layer 4040 may be GND or 0 V, or the conductive layer 4040 may be in a floating state.

A pixel electrode 4030 included in the liquid crystal element 4013 is electrically connected to the thin film transistor 4010. A counter electrode 4031 of the liquid crystal element 4013 is formed over the second substrate 4006. The liquid crystal element 4013 corresponds to a region where the pixel electrode 4030, the counter electrode 4031, and the liquid crystal layer 4008 overlap with each other. Note that the pixel electrode 4030 and the counter electrode 4031 are provided with an insulating layer 4032 and an insulating layer 4033 which each function as an alignment film, respectively.

Note that a light-transmitting substrate such as glass, ceramics, or plastics can be used as the first substrate 4001 and the second substrate 4006. As plastic, a fiberglass-reinforced plastics (FRP) plate, a polyvinyl fluoride (PVF) film, a polyester film, or an acrylic resin film can be used.

A columnar spacer denoted by reference numeral 4035 is obtained by selective etching of an insulating layer and is provided in order to control the distance (a cell gap) between the pixel electrode 4030 and the counter electrode 4031. Note that a spherical spacer may be used. The counter electrode 4031 is electrically connected to a common potential line formed over the same substrate as the thin film transistor 4010. The counter electrode 4031 and the common potential line can be electrically connected to each other through conductive particles arranged between the pair of substrates, using a common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes liquid crystal exhibiting a blue phase and a chiral agent has a short response time of 1 msec or less, has optical isotropy, which makes the alignment process unneeded, and has a small viewing angle dependence.

An example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process.

In the thin film transistor 4011, the insulating layer 4041 is formed in contact with the semiconductor layer including the channel formation region. The insulating layer 4041 can be formed using a material and a method which are similar to those of the insulating layer 427 described in Embodiment 1. In order to reduce the surface roughness of the thin film transistor, the thin film transistors are covered with the insulating layer 4021 which functions as a planarizing insulating layer. Here, a silicon oxide film is formed as the insulating layer 4041 with a sputtering method in a manner similar to that of Embodiment 1.

A protective insulating layer 4020 is formed over the insulating layer 4041. The protective insulating layer 4020 can be formed using a material and a method which are similar to those of the protective insulating layer 428 described in Embodiment 1. Here, a silicon nitride film is formed as the protective insulating layer 4020 with a PCVD method.

The insulating layer 4021 is formed as the planarizing insulating layer. The insulating layer 4021 can be formed using a heat-resistant organic material such as polyimide, acrylic, benzocyclobutene, polyamide, or epoxy. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating layers formed using these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

The insulating layer 4021 can be formed, depending on the material, with a method such as a sputtering method, an SOG method, a spin coating method, a dipping method, a spray coating method, a droplet discharge method (e.g., an ink-jet method, screen printing, or offset printing), or a tool such as a doctor knife, a roll coater, a curtain coater, or a knife coater. The step of baking the insulating layer 4021 serves also as the annealing step of the semiconductor layer, whereby the display device can be efficiently manufactured.

The pixel electrode 4030 and the counter electrode 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the pixel electrode 4030 and the counter electrode 4031 can be formed using a conductive composition containing a conductive macromolecule (also referred to as a conductive polymer). It is preferable that the pixel electrode formed using the conductive composition have a sheet resistance of 10,000 Ω/square or less and a light transmittance of 70% or more at a wavelength of 550 nm Further, the resistivity of the conductive macromolecule included in the conductive composition is preferably less than or equal to 0.1 Ω.cm.

As the conductive macromolecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and a potential are supplied to the signal-line driver circuit 4003 which is formed separately, the scan-line driver circuit 4004, and the pixel portion 4002 through an FPC 4018.

In addition, a connection terminal electrode 4015 is formed from the same conductive film as the pixel electrode 4030 included in the liquid crystal element 4013, and a terminal electrode 4016 is formed from the same conductive film as the source electrode layers and the drain electrode layers of the thin film transistors 4010 and 4011.

The connection terminal electrode 4015 is electrically connected to a terminal included in the FPC 4018 through an anisotropic conductive film 4019.

Note that FIGS. 6A1, 6A2, and 6B illustrate an example in which the signal-line driver circuit 4003 is formed separately and mounted on the first substrate 4001; however, this embodiment is not limited to this structure. The scan-line driver circuit may be separately formed and then mounted, or only part of the signal-line driver circuit or part of the scan-line driver circuit may be separately formed and then mounted.

Note that this embodiment can be freely combined with any of the other embodiments.

(Embodiment 6)

Figure 7A:
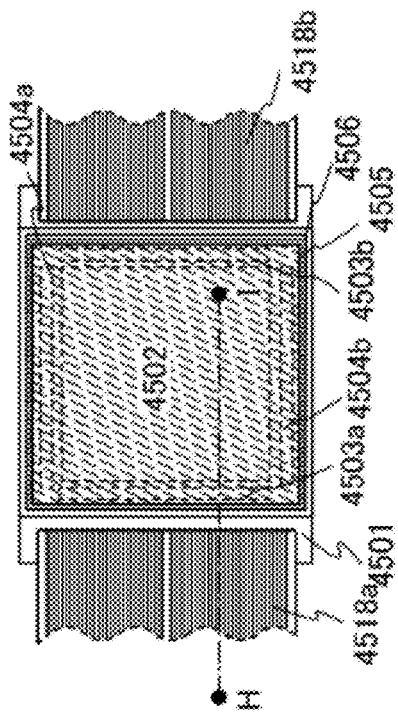
FIG. 7A is a plan view and FIG. 7B is a cross-sectional view illustrating a display device.
Figure 7B:
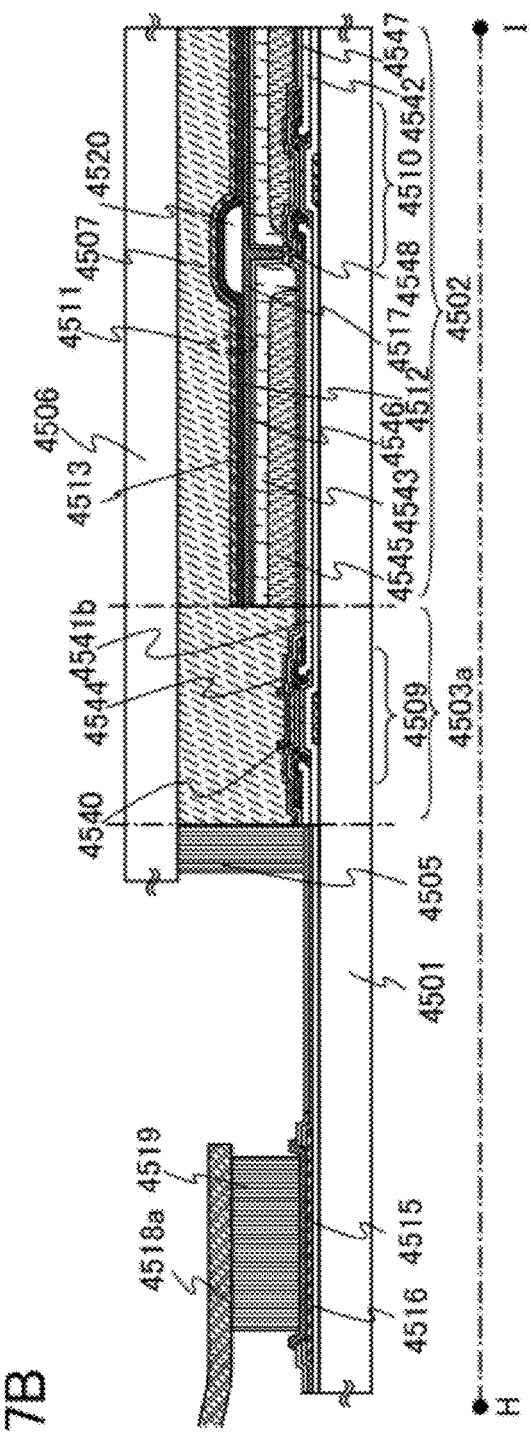

In this embodiment are described the appearance and a cross section of a light-emitting display panel (also referred to as a light-emitting panel), with reference to FIGS. 7A and 7B. FIG. 7A is a plan view of a panel in which a thin film transistor and a light-emitting element formed over a first substrate are sealed between the first substrate and a second substrate with a sealant. FIG. 7B is a cross-sectional view taken along line H-I in FIG. 7A.

A sealant 4505 is provided so as to surround a pixel portion 4502, signal-line driver circuits 4503a and 4503b, and scan-line driver circuits 4504a and 4504b which are provided over a first substrate 4501. In addition, a second substrate 4506 is provided over the pixel portion 4502, the signal line-driver circuits 4503a and 4503b, and the scan-line driver circuits 4504a and 4504b.

Accordingly, the pixel portion 4502, the signal-line driver circuits 4503a and 4503b, and the scan-line driver circuits 4504a and 4504b are sealed together with a filler 4507, by the first substrate 4501, the sealant 4505, and the second substrate 4506. It is preferable that a panel be packaged (sealed) with a protective film (such as a bonding film or an ultraviolet curable resin film) or a cover material with high air-tightness and little degasification so that the panel is not exposed to the outside air, in this manner.

Further, each of the pixel portion 4502, the signal-line driver circuits 4503a and 4503b, and the scan-line driver circuits 4504a and 4504b which are provided over the first substrate 4501 includes a plurality of thin film transistors. In FIG. 7B, a thin film transistor 4510 included in the pixel portion 4502 and a thin film transistor 4509 included in the signal-line driver circuit 4503a are illustrated as an example.

Any of the highly reliable thin film transistors each including an oxide semiconductor layer, which are described in any of Embodiments 1, 2, and 3, can be used as the thin film transistors 4509 and 4510. In this embodiment, the thin film transistors 4509 and 4510 are n-channel thin film transistors.

A conductive layer 4540 is provided over an insulating layer 4544 so as to overlap with a channel formation region of an oxide semiconductor layer in the thin film transistor 4509 for the driver circuit. The conductive layer 4540 is provided so as to overlap with the channel formation region of the oxide semiconductor layer, whereby the amount of change over time in threshold voltage of the thin film transistor 4011 before and after the BT test can be reduced. The conductive layer 4540 has a potential which is the same as that of the gate electrode of the thin film transistor 4509, and can function as a second gate electrode layer. In addition, the conductive layer 4540 may have a potential which is different from that of the gate electrode of the thin film transistor 4509. Alternatively, the potential of the conductive layer 4540 may be GND or 0 V, or the conductive layer 4540 may be in a floating state.

In a periphery of the oxide semiconductor layer of the thin film transistor 4509, an oxide insulating layer 4542 which covers a peripheral portion (including a side surface) of the oxide semiconductor layer is formed.

Further, the thin film transistor 4510 is electrically connected to a first electrode 4517 through a connection electrode layer 4548. Further, the oxide insulating layer 4542 which covers a peripheral portion (including a side surface) of the oxide semiconductor layer of the thin film transistor 4510 is formed.

The oxide insulating layer 4542 can be formed using a material and a method which is similar to that of the oxide insulating layer 426 described in Embodiment 1. In addition, the insulating layer 4544 which covers the oxide insulating layer 4542 is formed. The insulating layer 4544 can be formed using a material and a method which are similar to those of the protective insulating layer 428 described in Embodiment 1.

A color filter layer 4545 is formed over the thin film transistor 4510 so as to overlap with a light-emitting region of a light-emitting element 4511.

Further, in order to reduce the surface roughness of the color filter layer 4545, the color filter layer 4545 is covered with an overcoat layer 4543 which functions as a planarizing insulating film.

Further, an insulating layer 4546 is formed over the overcoat layer 4543. The insulating layer 4546 can be formed using a material and a method which are similar to those of the protective insulating layer 428 described in Embodiment 1.

The first electrode 4517 which is a pixel electrode included in the light-emitting element 4511 is electrically connected to a source electrode layer or a drain electrode layer of the thin film transistor 4510. Note that the structure of the light-emitting element 4511 is not limited to a stacked structure of the first electrode 4517, an electroluminescent layer 4512, and a second electrode 4513. The structure of the light-emitting element 4511 can be changed as appropriate depending on, for example, the direction in which light is extracted from the light-emitting element 4511.

A partition wall 4520 can be formed using an organic resin film, an inorganic insulating film, or organic polysiloxane. It is preferable that the partition wall 4520 be formed to have an opening over the first electrode 4517 so that a sidewall is formed as an inclined surface with curvature. Such an opening can be easily formed using a photosensitive resin material.

The electroluminescent layer 4512 is not limited to a single layer and may be formed using a plurality of layers stacked.

A protective film may be formed over a second electrode 4513 and the partition wall 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

Further, a variety of signals and a potential are supplied to the signal-line driver circuits 4503a and 4503b, the scan-line driver circuits 4504a and 4504b, and the pixel portion 4502 through FPCs 4518a and 4518b.

In addition, a connection terminal electrode 4515 is formed from the same conductive film as the first electrode 4517 included in the light-emitting element 4511, and a terminal electrode 4516 is formed from the same conductive film as a source electrode layer and a drain electrode layer of the thin film transistor 4509.

The connection terminal electrode 4515 is electrically connected to a terminal included in the FPC 4518a through an anisotropic conductive film 4519.

As the second substrate located in the direction in which light is extracted from the light-emitting element 4511 needs to have a light-transmitting property. In that case, a light-transmitting material such as a glass plate, a plastic plate, a polyester film, or an acrylic film is used for the second substrate.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment by which reflected light can be diffused by projections and depressions on the surface so as to reduce the glare can be performed.

As the signal-line driver circuits 4503a and 4503b and the scan-line driver circuits 4504a and 4504b, a driver circuit formed using a single crystal semiconductor or a polycrystalline semiconductor may be mounted. Alternatively, only the signal line-driver circuits or part thereof, or only the scan-line driver circuits or part thereof may be separately formed and mounted. This embodiment is not limited to the structure illustrated in FIGS. 7A and 7B.

Through the steps described above, a highly reliable light-emitting display device (display panel) can be manufactured.

Note that this embodiment can be freely combined with any of the other embodiments.

(Embodiment 7)

A display device disclosed in this specification can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a cellular phone (also referred to as a mobile phone or a cellular phone set), a portable game console, a portable information terminal, an audio reproducing device, a large-sized game machine such as a pachinko machine, and the like.

Figure 8A:
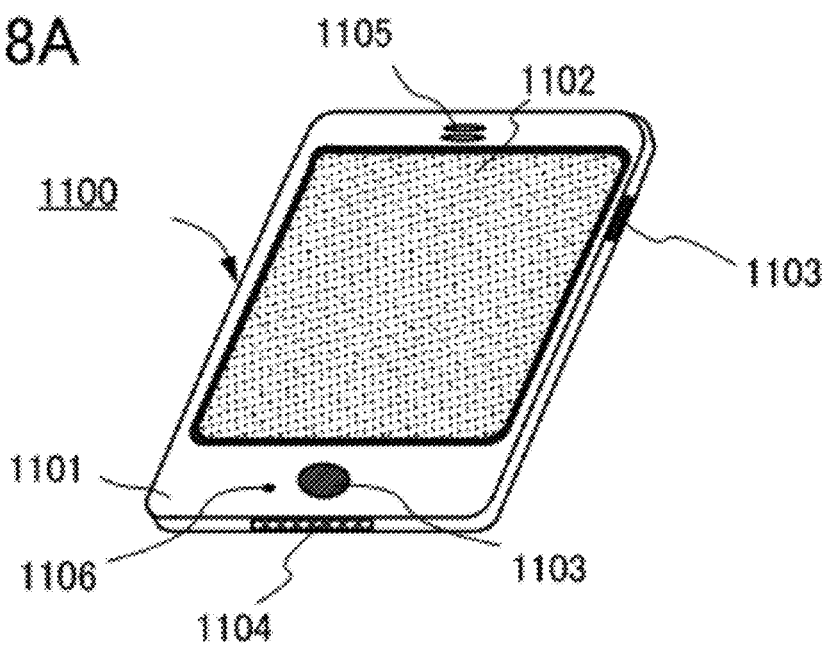
FIGS. 8A and 8B each illustrate an electronic device.

FIG. 8A illustrates an example of a cellular phone. The cellular phone 1100 is provided with a display portion 1102 incorporated in a housing 1101, an operation button 1103, an external connection port 1104, a speaker 1105, a microphone 1106, and the like.

When the display portion 1102 of the cellular phone 1100 is touched with a finger or the like, data can be inputted into the cellular phone 1100. Further, operations such as making calls, composing mails, or the like can be performed by touching the display portion 1102 with a finger or the like.

There are mainly three screen modes of the display portion 1102. The first mode is a display mode mainly for displaying images. The second mode is an input mode mainly for inputting data such as text. The third mode is a display-and-input mode, which is a combination of the two modes, i.e. a combination of the display mode and the input mode.

For example, in the case where a call is made or a mail is composed, a text input mode mainly for inputting text is selected for the display portion 1102 so that text displayed on a screen can be inputted. In that case, it is preferable to display a keyboard or number buttons on almost all area of the screen of the display portion 1102.

When a detection device including a sensor for detecting inclination, such as a gyroscope or an acceleration sensor, is provided inside the cellular phone 1100, display non the screen of the display portion 1102 can be automatically switched by determining the direction of the cellular phone 1100 (whether the cellular phone 1100 is placed horizontally or vertically for a landscape mode or a portrait mode).

The screen modes are switched by touching the display portion 1102 or operating the operation button 1103 of the housing 1101. Alternatively, the screen modes may be switched depending on the kind of the image displayed on the display portion 1102. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1102 is not performed for a certain period while a signal detected by the optical sensor in the display portion 1102 is detected, the screen mode may be controlled so as to be switched from the input mode to the display mode.

The display portion 1102 can also function as an image sensor. For example, an image of a palm print, a fingerprint, or the like is taken when the display portion 1102 is touched with a palm or a finger, whereby personal identification can be performed. Further, by providing a backlight or a sensing light source which emits a near-infrared light in the display portion, an image of a finger vein, a palm vein, or the like can be taken.

Figure 8B:
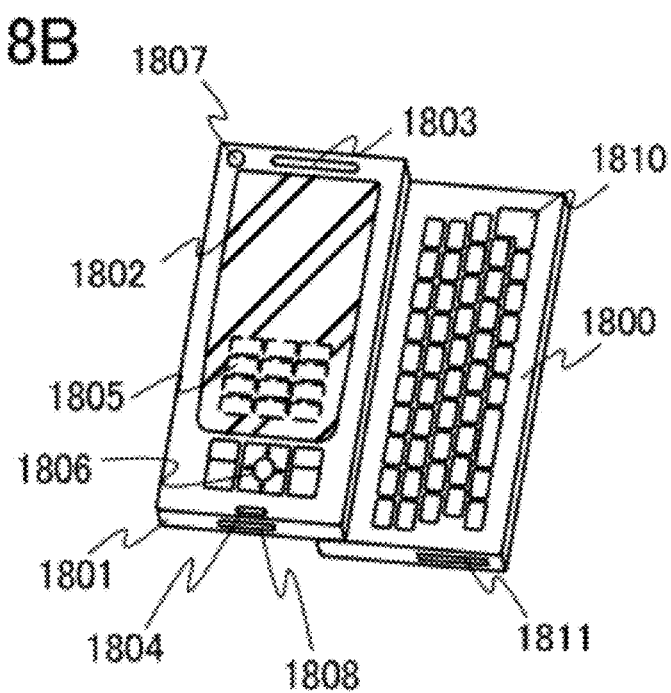

FIG. 8B also illustrates an example of a cellular phone. A portable information terminal whose example is illustrated in FIG. 8B can have a plurality of functions. For example, in addition to a telephone function, such a portable information terminal can have a function of processing a variety of data by incorporating a computer.

The portable information terminal illustrated in FIG. 8B includes two housings, a housing 1800 and a housing 1801. The housing 1800 includes a display panel 1802, a speaker 1803, a microphone 1804, a pointing device 1806, a camera 1807, an external connection terminal 1808, and the like. The housing 1801 includes a keyboard 1810, an external memory slot 1811, and the like. In addition, an antenna is incorporated in the housing 1801.

The display panel 1802 is provided with a touch panel. A plurality of operation keys 1805 which is displayed as images is illustrated by dashed lines in FIG. 8B.

Further, in addition to the above structure, a contactless IC chip, a small memory device, or the like may be incorporated.

The display device can be used for the display panel 1802 and the direction of display is changed appropriately depending on an application mode. Further, the display device is provided with the camera 1807 on the same surface as the display panel 1802, and thus it can be used as a videophone. The speaker 1803 and the microphone 1804 can be used for videophone calls, recording, and playing sound, and the like as well as voice calls. Moreover, the housings 1800 and 1801 in a state where they are developed as illustrated in FIG. 8B can shift so that one is lapped over the other by sliding; therefore, the size of the portable information terminal can be reduced, which makes the portable information terminal suitable for being carried.

The external connection terminal 1808 can be connected to various types of cables such as a charging cable and a USB cable, and charging and data communication with a personal computer are possible. Moreover, a storage medium can be inserted into the external memory slot 1811 so that a larger amount of data can be stored and can be moved.

Further, in addition to the above functions, an infrared communication function, a television reception function, or the like may be provided.

Figure 9A:
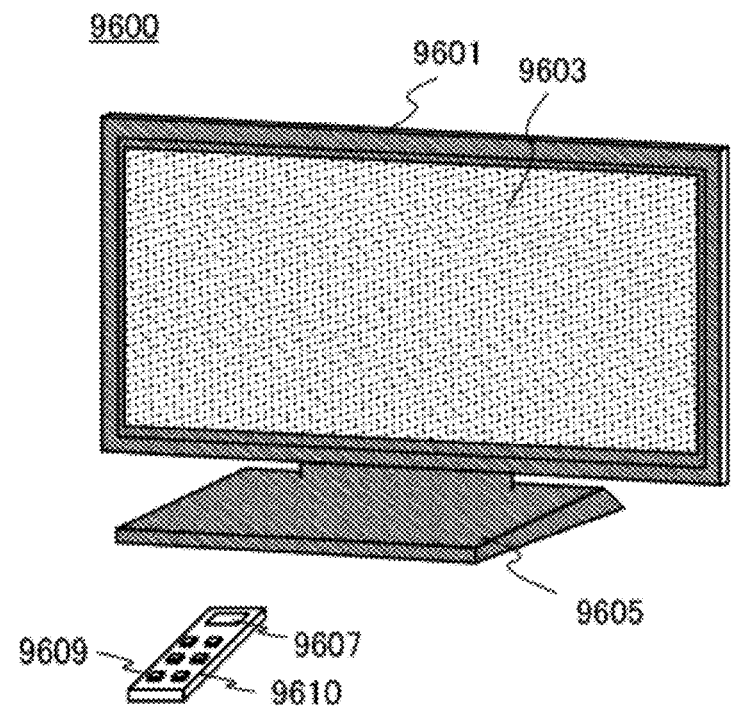
FIGS. 9A and 9B each illustrate an electronic device.

FIG. 9A illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with operation keys 9609 of the remote controller 9610 so that an image displayed on the display portion 9603 can be controlled. Furthermore, the remote controller 9610 may be provided with a display portion 9607 for displaying data outputted from the remote controller 9610.

Note that the television set 9600 is provided with a receiver, a modem, and the like. With the use of the receiver, general television broadcasting can be received. Moreover, when the television set 9600 is connected to a communication network with or without wires via the modem, one-way (from a sender to a receiver) or two-way (between a sender and a receiver or between receivers) information communication can be performed.

Figure 9B:
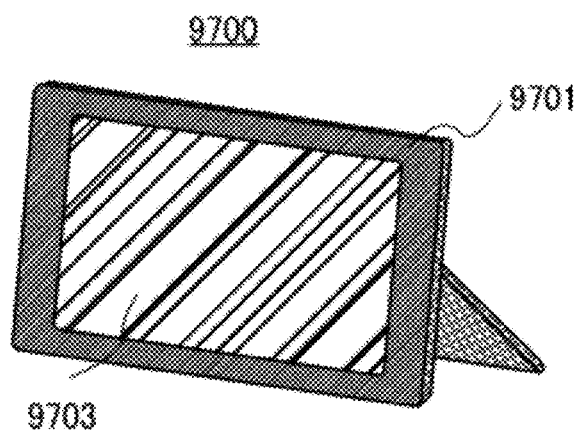

FIG. 9B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection terminal (e.g., a USB terminal), an external memory slot, and the like. Although these components may be provided on the surface on which the display portion is provided, it is preferable to provide them on the side surface or the back surface for the design of the digital photo frame 9700. For example, a memory storing data of an image taken by a digital camera is inserted in the external memory slot of the digital photo frame, and the image data can be transferred and displayed on the display portion 9703.

The digital photo frame 9700 may be configured to transmit and receive data wirelessly. The structure may be employed in which desired image data is transferred wirelessly and displayed.

Figure 10:
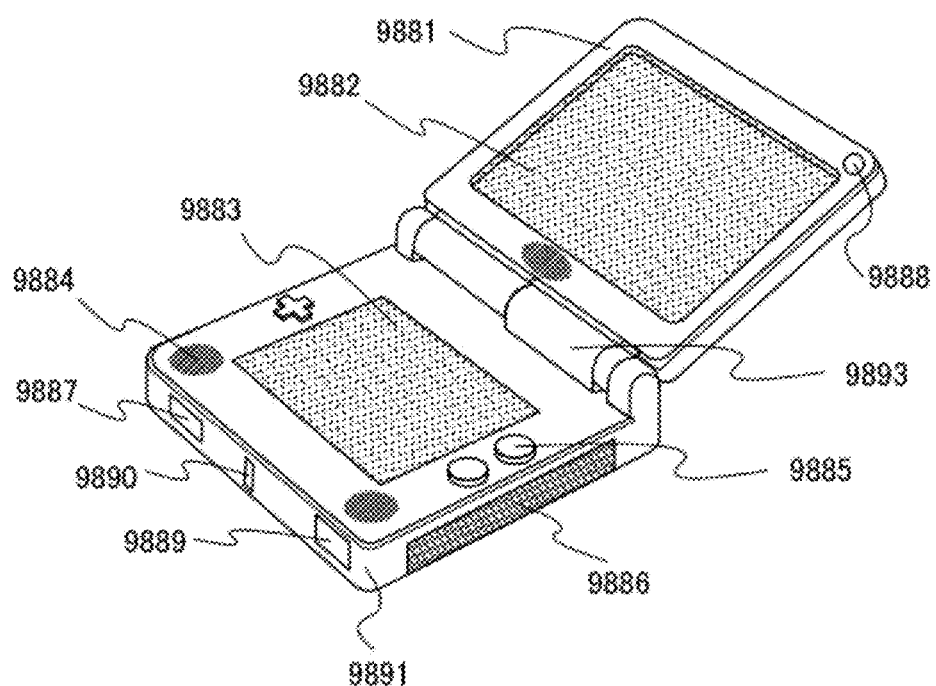
FIG. 10 illustrates an electronic device.

FIG. 10 is a portable game machine and includes two housings, a housing 9881 and a housing 9891, which are connected with a joint portion 9893 so that the portable game machine can be opened or folded. A display portion 9882 and a display portion 9883 are incorporated in the housing 9881 and the housing 9891, respectively.

Moreover, the portable game machine illustrated in FIG. 10 is provided with a speaker portion 9884, a recording medium insertion portion 9886, an LED lamp 9890, input means (operation keys 9885, a connection terminal 9887, a sensor 9888 (having a function of measuring force, displacement, position, velocity, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889, and the like. It is needless to say that the structure of the portable amusement machine is not limited to the above and other structures provided with at least a thin film transistor disclosed in this specification can be employed. The portable amusement machine may include other accessory equipment as appropriate. The portable game machine illustrated in FIG. 10 has a function of reading a program or data stored in a recording medium to display it on the display portion, and a function of sharing information with another portable game machine by wireless communication. Note that functions of the portable game machine illustrated in FIG. 10 are not limited to those described above and the portable game machine can have a variety of functions.

As described above, the display device described in other embodiments can be arranged in display panels of a variety of electronic appliances such as the above ones.

Note that this embodiment can be freely combined with any of the other embodiments.

The present application is based on Japanese Patent Application Ser. No. 2009-204801 filed with the Japan Patent Office on Sep. 4, 2009, the entire contents of which are hereby incorporated by reference.

EXPLANATION OF REFERENCE

400: substrate, 402: gate insulating layer, 404: oxide semiconductor layer, 417: conductive layer, 422: source wiring layer, 426: oxide insulating layer, 427: insulating layer, 428: protective insulating layer, 430: capacitor wiring layer, 431: capacitor electrode layer, 440: thin film transistor, 442: connection electrode layer, 443: channel formation region, 449: connection electrode layer, 450: thin film transistor, 452: connection electrode layer, 453: color filter layer, 456: planarization insulating layer, 458: overcoat layer, 459: partition wall, 460: thin film transistor, 470: thin film transistor, 480: thin film transistor, 421a: gate electrode layer, 421b: gate electrode layer, 421c: gate wiring layer, 424a: high-resistance source region, 424b: high-resistance drain region, 424c: region, 424d: region, 424e: region, 424f: region, 425a: source electrode layer, 425b: drain electrode layer, 426a: oxide insulating layer, 426b: oxide insulating layer, 444c: region, 444d: region, 445a: source electrode layer, 445b: drain electrode layer, 446a: oxide conductive layer, 446b: oxide conductive layer, 451a: gate electrode layer, 451b: gate electrode layer, 455a: source electrode layer, 455b: drain electrode layer, 457a: pixel electrode layer, 457b: electrode, 1100: cellular phone, 1101: housing, 1102: display portion, 1103: operation button, 1104: external connection port, 1105: speaker, 1106: microphone, 1800: housing, 1801: housing, 1802: display panel, 1803: speaker, 1804: microphone, 1805: operation keys, 1806: pointing device, 1807: camera, 1808: external connection terminal, 1810: keyboard, 1811: external memory slot, 4001: substrate, 4002: pixel portion, 4003: signal-line driver circuit, 4004: scan-line driver circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4020: protective insulating layer, 4021: insulating layer, 4030: pixel electrode, 4031: counter electrode, 4032:insulating layer, 4040: conductive layer, 4041: insulating layer, 4501: substrate, 4502: pixel portion, 4505: sealant, 4506: substrate, 4507: filler, 4509: thin film transistor, 4510: thin film transistor, 4511: light-emitting element, 4512: electroluminescent layer, 4513: electrode, 4515: connection terminal electrode, 4516: terminal electrode, 4517: electrode, 4519: anisotropic conductive film, 4520: partition wall, 4540: conductive layer, 4542: oxide insulating layer, 4543: overcoat layer, 4544: insulating layer, 4545: color filter layer, 4546: insulating layer, 4548: connection electrode layer, 4503*a*: signal-line driver circuit, 4503*b*: signal-line driver circuit, 4504*a*: scan-line driver circuit, 4504*b*: scan-line driver circuit, 4518*a*: FPC, 9600: television set, 9601: housing, 9603: display portion, 9605: stand, 9607: display portion, 9609: operation keys, 9610: remote controller, 9700: digital photo frame, 9701: housing, 9703: display portion, 9881: housing, 9882: display portion, 9883: display portion, 9884: speaker portion, 9885: operation keys, 9886: recording medium insertion portion, 9887: connection terminal, 9888: sensor, 9889: microphone, 9890: LED lamp, 9891: housing, 9893: joint portion.

The invention claimed is:

1. A transistor comprising:
   a gate electrode layer;
   a gate insulating layer over the gate electrode layer;
   an oxide semiconductor layer over the gate insulating layer;
   a source electrode layer and a drain electrode layer over the oxide semiconductor layer; and
   an oxide insulating layer in contact with the oxide semiconductor layer,
   wherein a peak of a desorption constituent, which is derived from moisture, is not shown in a spectrum of the oxide semiconductor layer, which is shown with thermal desorption spectroscopy in a temperature range of greater than or equal to 200° C. and less than or equal to 350° C.

2. The transistor according to claim 1, wherein the oxide semiconductor layer is amorphous.

3. The transistor according to claim 1, wherein the source electrode layer and the drain electrode layer comprise a film including an element selected from Al, Cr, Cu, Ta, Ti, Mo, and W as its main component or an alloy film thereof.

4. The transistor according to claim 1, wherein the oxide insulating layer comprises a material selected from the group consisting of silicon oxide, silicon nitride oxide, aluminum oxide, and aluminum oxynitride.

5. The transistor according to claim 1 further comprising a pair of oxide conductive layers partly overlapping with the oxide semiconductor layer over the gate insulating layer,
   wherein the pair of oxide conductive layers includes a crystal region.

6. A display device comprising:
   a pixel portion and a driver circuit each including a transistor over a substrate, the transistor comprising:
   a gate electrode layer over the substrate;
   a gate insulating layer over the gate electrode layer;
   an oxide semiconductor layer over the gate insulating layer;
   a source electrode layer and a drain electrode layer the oxide semiconductor layer; and
   an oxide insulating layer in contact with the oxide semiconductor layer,
   wherein a peak of a desorption constituent, which is derived from moisture, is not shown in a spectrum of the oxide semiconductor layer, which is shown with thermal desorption spectroscopy in a temperature range of greater than or equal to 200° C. and less than or equal to 350° C.

7. The display device according to claim 6, wherein the oxide semiconductor layer is amorphous.

8. The display device according to claim 6, wherein the source electrode layer and the drain electrode layer comprise a film including an element selected from Al, Cr, Cu, Ta, Ti, Mo, and W as its main component or an alloy film thereof.

9. The display device according to claim 6, wherein the oxide insulating layer comprises a material selected from the group consisting of silicon oxide, silicon nitride oxide, aluminum oxide, and aluminum oxynitride.

10. The transistor according to claim 5,
    wherein the pair of oxide conductive layers comprises a material selected from the group consisting of indium oxide, an indium oxide-tin oxide alloy, an indium oxide-zinc oxide alloy, zinc oxide, zinc aluminum oxide, zinc aluminum oxynitride, and zinc gallium oxide.

11. The display device according to claim 6 further comprising a pair of oxide conductive layers partly overlapping with the oxide semiconductor layer over the gate insulating layer,
    wherein the pair of oxide conductive layers includes a crystal region.

12. The display device according to claim 11,
    wherein the pair of oxide conductive layers comprises a material selected from the group consisting of indium oxide, an indium oxide-tin oxide alloy, an indium oxide-zinc oxide alloy, zinc oxide, zinc aluminum oxide, zinc aluminum oxynitride, and zinc gallium oxide.

* * * * *

UNITED STATES PATENT AND TRADEMARK OFFICE
CERTIFICATE OF CORRECTION

PATENT NO. : 8,389,989 B2
APPLICATION NO. : 12/869278
DATED : March 5, 2013
INVENTOR(S) : Shunpei Yamazaki et al.

Page 1 of 1

It is certified that error appears in the above-identified patent and that said Letters Patent is hereby corrected as shown below:

In the Specifications

At column 1, line 43, "2007-23861" should be --2007-123861--;

At column 14, line 42, "1A to 2E" should be --1A to 1E--;

At column 26, line 26, "non the" should be --on the--.

Signed and Sealed this
Twenty-first Day of May, 2013

Teresa Stanek Rea
*Acting Director of the United States Patent and Trademark Office*